US007175776B2

(12) United States Patent
Silverbrook

(10) Patent No.: US 7,175,776 B2
(45) Date of Patent: *Feb. 13, 2007

(54) METHOD OF FABRICATING A MICRO-ELECTROMECHANICAL DEVICE WITH A THERMAL ACTUATOR

(75) Inventor: Kia Silverbrook, Balmain (AU)

(73) Assignee: Silverbrook Research Pty Ltd, Balmain (AU)

( * ) Notice: Subject to any disclaimer, the term of this patent is extended or adjusted under 35 U.S.C. 154(b) by 0 days.

This patent is subject to a terminal disclaimer.

(21) Appl. No.: 11/281,446

(22) Filed: Nov. 18, 2005

(65) Prior Publication Data

US 2006/0075632 A1 Apr. 13, 2006

Related U.S. Application Data

(63) Continuation of application No. 10/982,788, filed on Nov. 8, 2004, now Pat. No. 7,001,008, which is a continuation of application No. 10/713,085, filed on Nov. 17, 2003, now Pat. No. 6,854,827, which is a continuation of application No. 09/693,135, filed on Oct. 20, 2000, now Pat. No. 6,854,825.

(51) Int. Cl.
*B41J 2/04* (2006.01)
*H01L 21/00* (2006.01)

(52) U.S. Cl. .............................. 216/27; 216/2; 216/41; 438/21; 29/890.1; 347/54; 347/56

(58) Field of Classification Search .................... 216/2, 216/27, 41; 438/21; 29/890.1; 347/54, 347/56
See application file for complete search history.

(56) References Cited

U.S. PATENT DOCUMENTS

| | | | |
|---|---|---|---|
| 4,734,718 | A | 3/1988 | Iwagami et al. |
| 4,736,212 | A | 4/1988 | Oda et al. |
| 5,184,344 | A | 2/1993 | Takeuchi et al. |
| 5,528,271 | A | 6/1996 | Ebisawa |
| 5,665,249 | A | 9/1997 | Burke et al. |

(Continued)

FOREIGN PATENT DOCUMENTS

| | | | |
|---|---|---|---|
| EP | 1118467 | A | 7/2001 |

(Continued)

*Primary Examiner*—Shamim Ahmed

(57) ABSTRACT

A method of fabricating a micro-electromechanical device includes the step of forming electrical connections to drive circuitry on a wafer substrate. A first sacrificial structure is formed on the wafer substrate. The first sacrificial structure corresponds at least to a mechanical arm to be formed on the sacrificial structure, spaced from the wafer substrate. At least the mechanical arm is formed on the sacrificial structure. A second sacrificial structure is formed on the wafer substrate such that the second sacrificial structure corresponds at least to a heater element to be connected to the electrical connections, isolated from and overlying the mechanical arm. The heater element is formed on the second sacrificial structure. A third sacrificial structure is formed on the wafer substrate such that the third sacrificial structure corresponds at least to a structural formation that serves to fasten the heater element to the mechanical arm at a position spaced from the electrical connections such that resistive heating and subsequent cooling of the heater element as a result of an electrical current passing through the heater element results in displacement of the structural formation relative to the substrate. The structural formation is formed on the wafer substrate.

7 Claims, 27 Drawing Sheets

U.S. PATENT DOCUMENTS

| | | | | |
|---|---|---|---|---|
| 5,909,230 | A * | 6/1999 | Choi et al. | 347/54 |
| 5,929,877 | A | 7/1999 | Hetzer et al. | |
| 6,227,660 | B1 | 5/2001 | McClelland et al. | |
| 6,450,615 | B2 | 9/2002 | Kojima et al. | |
| 2004/0069743 | A1* | 4/2004 | Silverbrook | 216/27 |

FOREIGN PATENT DOCUMENTS

| | | | |
|---|---|---|---|
| JP | 04-169238 | A | 6/1992 |
| JP | 05-330041 | A | 12/1993 |
| JP | 06134986 | | 5/1994 |
| JP | 10250091 | A | 9/1998 |
| JP | 10-305583 | A | 11/1998 |
| JP | 2001-138540 | | 5/2001 |

* cited by examiner

METHOD OF FABRICATING A MICRO-ELECTROMECHANICAL DEVICE WITH A THERMAL ACTUATOR

CROSS REFERENCES TO RELATED APPLICATION

The present application is a continuation of U.S. application Ser. No. 10/982,788 filed on Nov. 8, 2004, now issued as U.S. Pat. No. 7,001,008, which is a continuation of U.S. application Ser. No. 10/713,085 filed on Nov. 17, 2003, now issued as U.S. Pat. No. 6,854,827, which is a continuation of U.S. application Ser. No. 09/693,135 filed on Oct. 20, 2000, now issued as U.S. Pat. No. 6,854,825.

CO-PENDING APPLICATIONS

Various methods, systems and apparatus relating to the present invention are disclosed in the following co-pending applications filed by the applicant or assignee of the present invention simultaneously with the present application:

| | | | | |
|---|---|---|---|---|
| 09/575,197 | 09/575,195 | 09/575,159 | 09/575,132 | 09/575,123 |
| 09/575,148 | 09/575,130 | 09/575,165 | 09/575,153 | 09/575,118 |
| 09/575,131 | 09/575,116 | 09/575,144 | 09/575,139 | 09/575,186 |
| 09/575,185 | 09/575,191 | 09/575,145 | 09/575,192 | 09/575,181 |
| 09/575,193 | 09/575,156 | 09/575,183 | 09/575,160 | 09/575,150 |
| 09/575,169 | 09/575,184 | 09/575,128 | 09/575,180 | 09/575,149 |
| 09/575,179 | 09/575,187 | 09/575,155 | 09/575,133 | 09/575,143 |
| 09/575,196 | 09/575,198 | 09/575178 | 09/575,164 | 09/575,146 |
| 09/575,174 | 09/575,163 | 09/575,168 | 09/575,154 | 09/575,129 |
| 09/575,124 | 09/575,188 | 09/575,189 | 09/575,162 | 09/575,172 |
| 09/575,170 | 09/575,171 | 09/575,161 | 09/575,141 | 09/575,125 |
| 09/575,142 | 09/575,140 | 09/575,190 | 09/575,138 | 09/575,126 |
| 09/575,127 | 09/575,158 | 09/575,117 | 09/575,147 | 09/575,152 |
| 09/575,176 | 09/575,151 | 09/575,177 | 09/575,175 | 09/575,115 |
| 09/575,114 | 09/575,113 | 09/575112 | 09/575,111 | 09/575,108 |
| 09/575,109 | 09/575,182 | 09/575,173 | 09/575,194 | 09/575,136 |
| 09/575,119 | 09/575,135 | 09/575,157 | 09/575,166 | 09/575,134 |
| 09/575,121 | 09/575,137 | 09/575,167 | 09/575,120 | 09/575,122 |

The disclosures of these co-pending applications are incorporated herein by cross-reference.

FIELD OF THE INVENTION

The present invention relates to printed media production and in particular ink jet printers.

BACKGROUND TO THE INVENTION

Ink jet printers are a well known and widely used form of printed media production. Colorants, usually ink, are fed to an array of micro-processor controlled nozzles on a printhead. As the print head passes over the media, colorant is ejected from the array of nozzles to produce the printing on the media substrate.

Printer performance depends on factors such as operating cost, print quality, operating speed and ease of use. The mass, frequency and velocity of individual ink drops ejected from the nozzles will affect these performance parameters. In general terms, smaller, faster droplets ejected at higher frequency provide cost, speed and print quality advantages.

In light of this, it has been an overriding aim of printhead design to reduce the size of the ink nozzles and thereby the size of the droplets ejected. Recently, the array of nozzles has been formed using microelectromechanical systems (MEMS) technology, which have mechanical structures with sub-micron thicknesses. This allows the production of printheads that can rapidly eject ink droplets sized in the picolitre ($\times 10^{-12}$ liter) range.

While the microscopic structures of these printheads can provide high speeds and good print quality at relatively low costs, their size makes the nozzles extremely fragile and vulnerable to damage from the slightest contact with finger, dust or the media substrate. This can make the printheads impractical for many applications where a certain level of robustness is necessary.

SUMMARY OF THE INVENTION

Accordingly, the present invention provides a nozzle guard for an ink jet printer printhead with an array of nozzles and respective colorant ejection means for ejecting colorant onto a substrate to be printed, wherein the nozzle guard is adapted to be positioned to inhibit damaging contact with the exterior of the array of nozzles.

In this specification the term "nozzle" is to be understood as an element defining an opening and not the opening itself.

Preferably, the nozzle guard has a shield covering the exterior of the nozzles wherein the shield has an array of passages in registration with the array of nozzles so as not to impede the normal trajectory of the colorant ejected from each nozzle. In a further preferred form, the shield is formed from silicon.

The nozzle guard may further include fluid inlet openings for directing fluid through the passages, to inhibit the build up of foreign particles on the nozzle array.

The nozzle guard may include a support means for supporting the nozzle shield on the printhead. The support means may be formed integrally with the shield, the support means comprising a pair of spaced support elements one being arranged at each end of the nozzle shield.

In this embodiment, the fluid inlet openings may be arranged in one of the support elements.

It will be appreciated that, when air is directed through the openings, over the nozzle array and out through the passages, the build up of foreign particles on the nozzle array is inhibited.

The fluid inlet openings may be arranged in the support element remote from a bond pad of the nozzle array.

The invention extends also to a printhead for an ink jet printer, the printhead including:

an array of nozzles and respective colorant ejection means for ejecting colorant onto a media substrate to be printed; and, a nozzle guard, as described above, positioned to inhibit damaging contact with the exterior of the array of nozzles.

By providing a nozzle guard on the printhead, the nozzle structures can be protected from being touched or bumped against most other surfaces. To optimize the protection provided, the guard forms a flat shield covering the exterior side of the nozzles wherein the shield has an array of passages big enough to allow the ejection of colorant droplets but small enough to prevent inadvertent contact or the ingress of most dust particles. By forming the shield from silicon, its coefficient of thermal expansion substantially matches that of the nozzle array. This will help to prevent the array of passages in the shield from falling out of register with the nozzle array. Using silicon also allows the shield to be accurately micro-machined using MEMS techniques. Furthermore, silicon is very strong and substantially non deformable.

The invention also includes a printer that includes a printhead with nozzle guard as described above. The printer includes a source of pressurized fluid. The fluid is preferably air and the source of pressurized fluid id preferably a pump.

BRIEF DESCRIPTION OF THE DRAWINGS

Preferred embodiments of the invention are now described, by way of example only, with reference to the accompanying drawings in which.

DETAILED DESCRIPTION OF THE DRAWINGS

Figure 1:
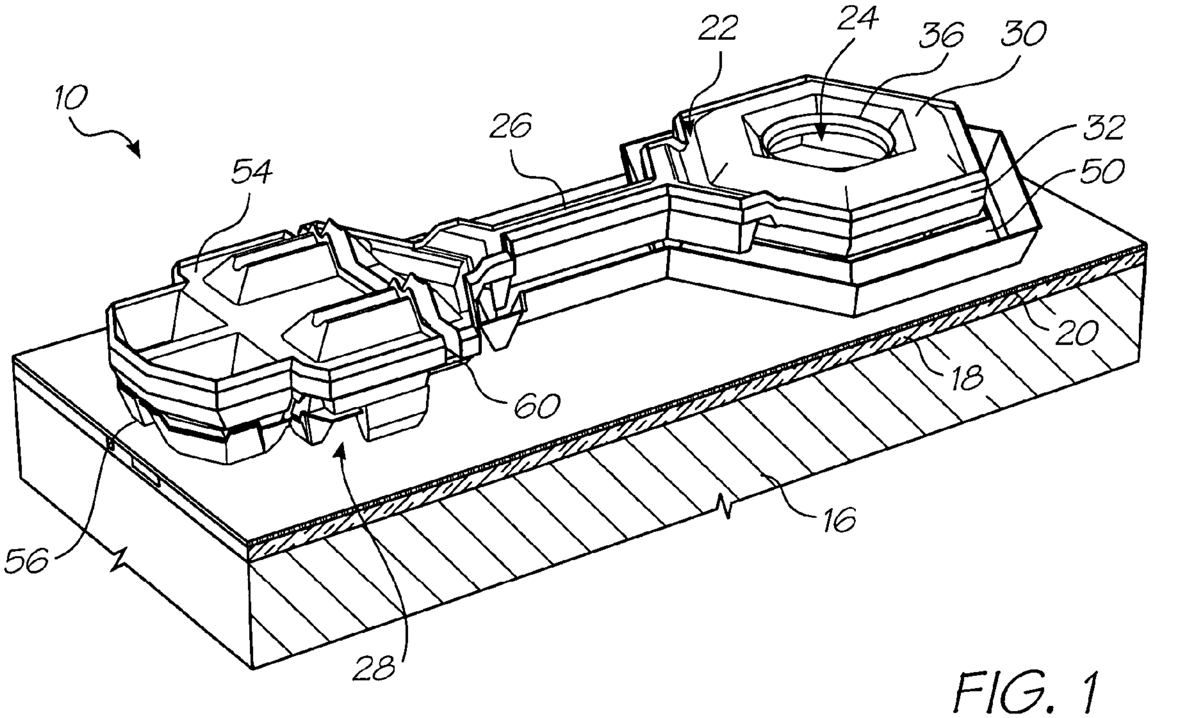
FIG. 1 shows a three dimensional, schematic view of a nozzle assembly for an ink jet printhead.

Referring initially to FIG. 1 of the drawings, a nozzle assembly, in accordance with the invention is designated generally by the reference numeral 10. An ink jet printhead has a plurality of nozzle assemblies 10 arranged in an array 14 (FIGS. 5 and 6) on a silicon substrate 16. The array 14 will be described in greater detail below.

The assembly 10 includes a silicon substrate or wafer 16 on which a dielectric layer 18 is deposited. A CMOS passivation layer 20 is deposited on the dielectric layer 18.

Each nozzle assembly 10 includes a nozzle 22 defining a nozzle opening 24, a connecting member in the form of a lever arm 26 and an actuator 28. The lever arm 26 connects the actuator 28 to the nozzle 22.

Figure 2:
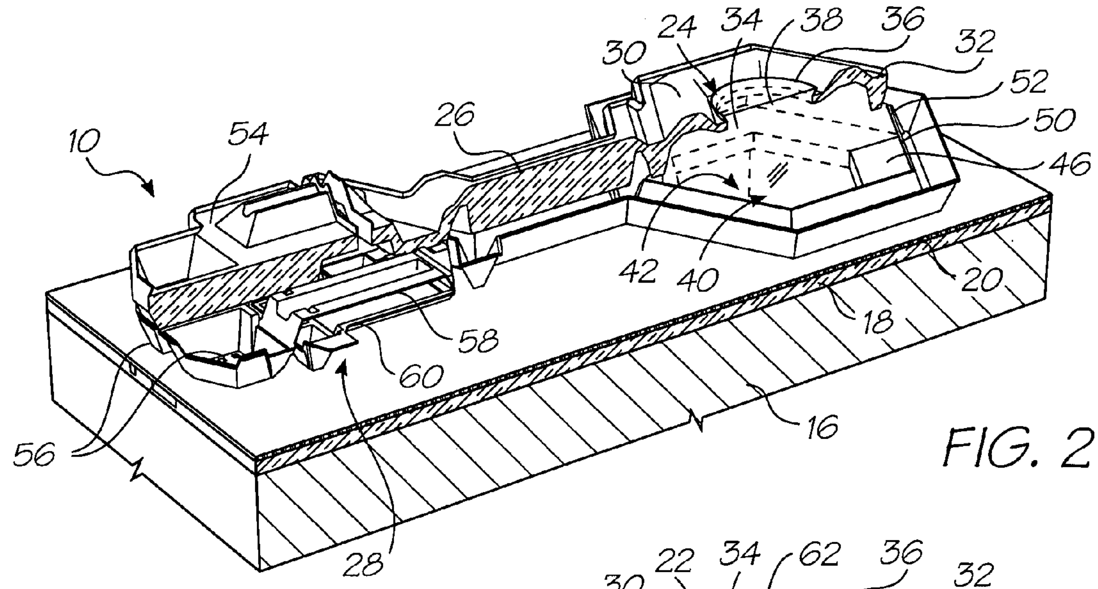
FIGS. 2 to 4 show a three dimensional, schematic illustration of an operation of the nozzle assembly of FIG. 1.
Figure 3:
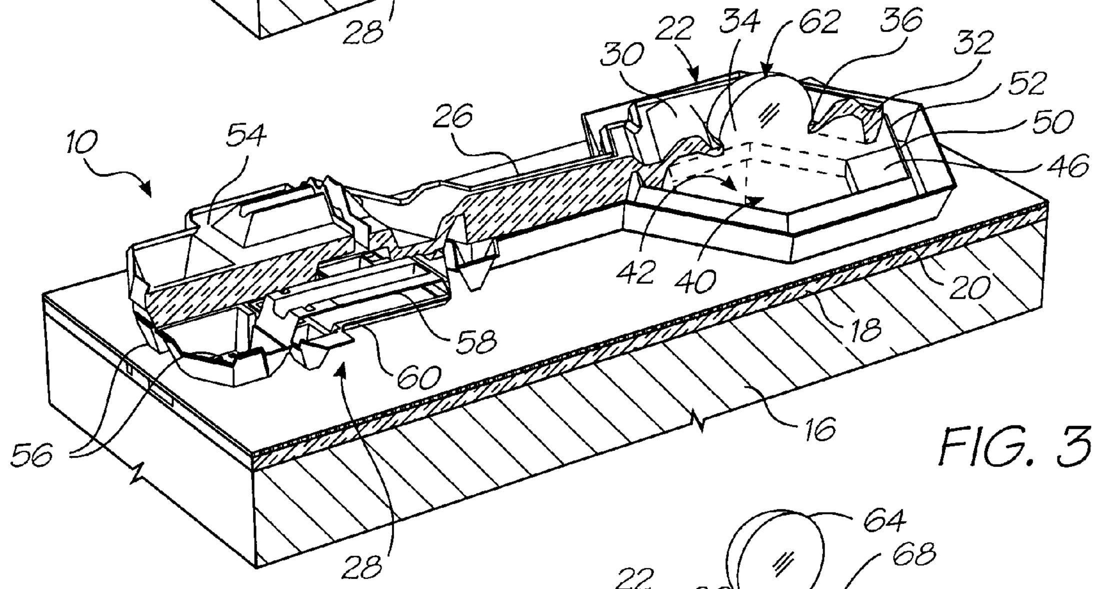
Figure 4:
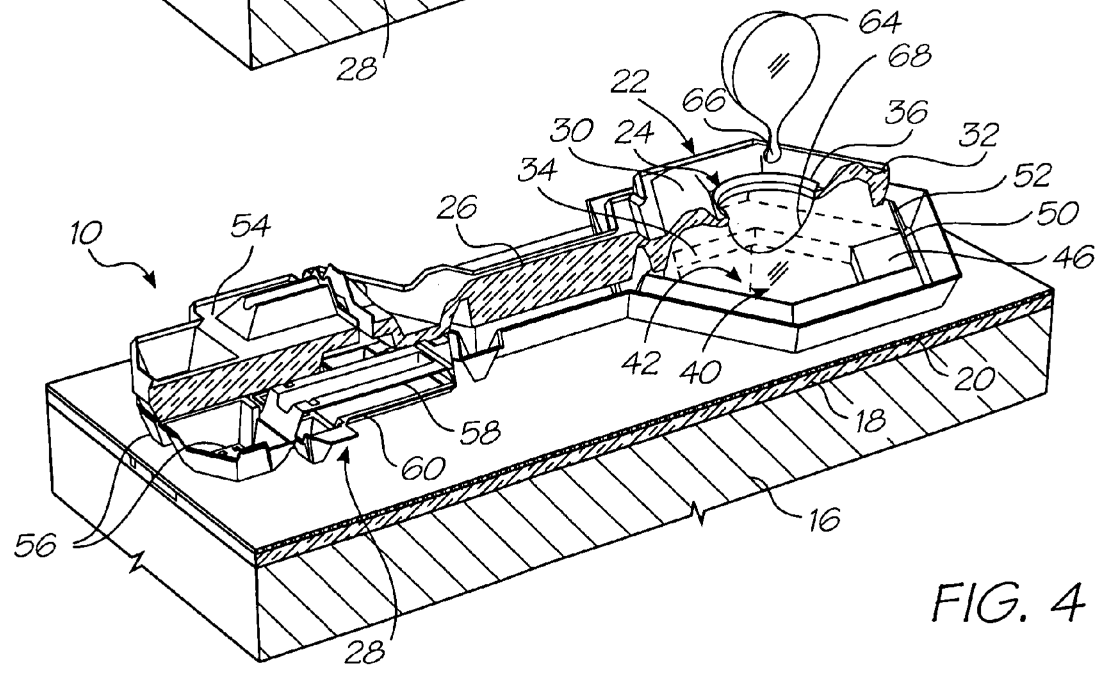

As shown in greater detail in FIGS. 2 to 4, the nozzle 22 comprises a crown portion 30 with a skirt portion 32 depending from the crown portion 30. The skirt portion 32 forms part of a peripheral wall of a nozzle chamber 34. The nozzle opening 24 is in fluid communication with the nozzle chamber 34. It is to be noted that the nozzle opening 24 is surrounded by a raised rim 36 which “pins” a meniscus 38 (FIG. 2) of a body of ink 40 in the nozzle chamber 34.

An ink inlet aperture 42 (shown most clearly in FIG. 6 of the drawing) is defined in a floor 46 of the nozzle chamber 34. The aperture 42 is in fluid communication with an ink inlet channel 48 defined through the substrate 16.

A wall portion 50 bounds the aperture 42 and extends upwardly from the floor portion 46. The skirt portion 32, as indicated above, of the nozzle 22 defines a first part of a peripheral wall of the nozzle chamber 34 and the wall portion 50 defines a second part of the peripheral wall of the nozzle chamber 34.

The wall 50 has an inwardly directed lip 52 at its free end which serves as a fluidic seal which inhibits the escape of ink when the nozzle 22 is displaced, as will be described in greater detail below. It will be appreciated that, due to the viscosity of the ink 40 and the small dimensions of the spacing between the lip 52 and the skirt portion 32, the inwardly directed lip 52 and surface tension function as an effective seal for inhibiting the escape of ink from the nozzle chamber 34.

The actuator 28 is a thermal bend actuator and is connected to an anchor 54 extending upwardly from the substrate 16 or, more particularly from the CMOS passivation layer 20. The anchor 54 is mounted on conductive pads 56 which form an electrical connection with the actuator 28.

The actuator 28 comprises a first, active beam 58 arranged above a second, passive beam 60. In a preferred embodiment, both beams 58 and 60 are of, or include, a conductive ceramic material such as titanium nitride (TiN).

Both beams 58 and 60 have their first ends anchored to the anchor 54 and their opposed ends connected to the arm 26. When a current is caused to flow through the active beam 58 thermal expansion of the beam 58 results. As the passive beam 60, through which there is no current flow, does not expand at the same rate, a bending moment is created causing the arm 26 and, hence, the nozzle 22 to be displaced downwardly towards the substrate 16 as shown in FIG. 3. This causes an ejection of ink through the nozzle opening 24 as shown at 62. When the source of heat is removed from the active beam 58, i.e. by stopping current flow, the nozzle 22 returns to its quiescent position as shown in FIG. 4. When the nozzle 22 returns to its quiescent position, an ink droplet 64 is formed as a result of the breaking of an ink droplet neck as illustrated at 66 in FIG. 4. The ink droplet 64 then travels on to the print media such as a sheet of paper. As a result of the formation of the ink droplet 64, a “negative” meniscus is formed as shown at 68 in FIG. 4 of the drawings. This “negative” meniscus 68 results in an inflow of ink 40 into the nozzle chamber 34 such that a new meniscus 38 (FIG. 2) is formed in readiness for the next ink drop ejection from the nozzle assembly 10.

Figure 5:
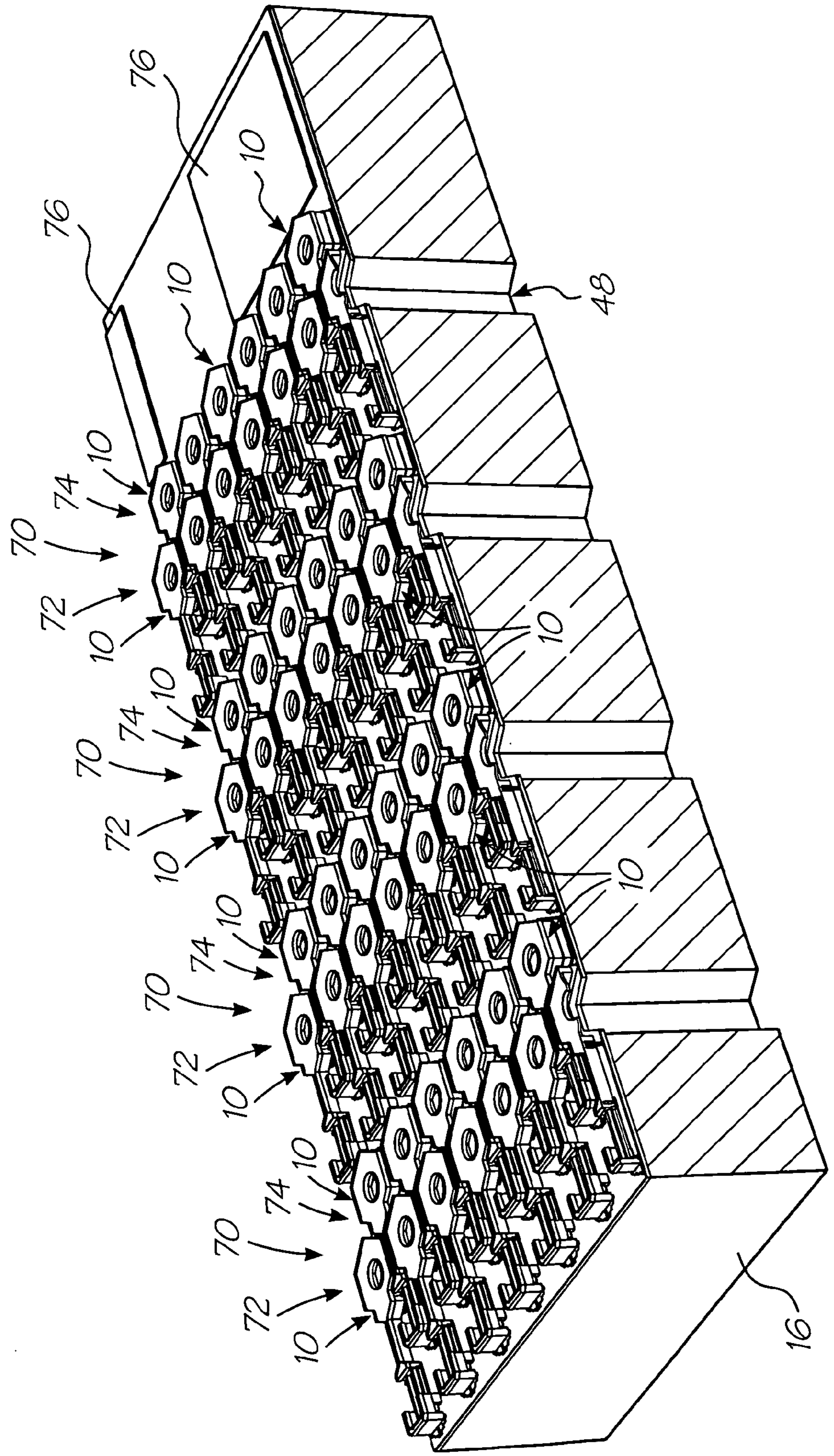
FIG. 5 shows a three dimensional view of a nozzle array constituting an ink jet printhead.
Figure 6:
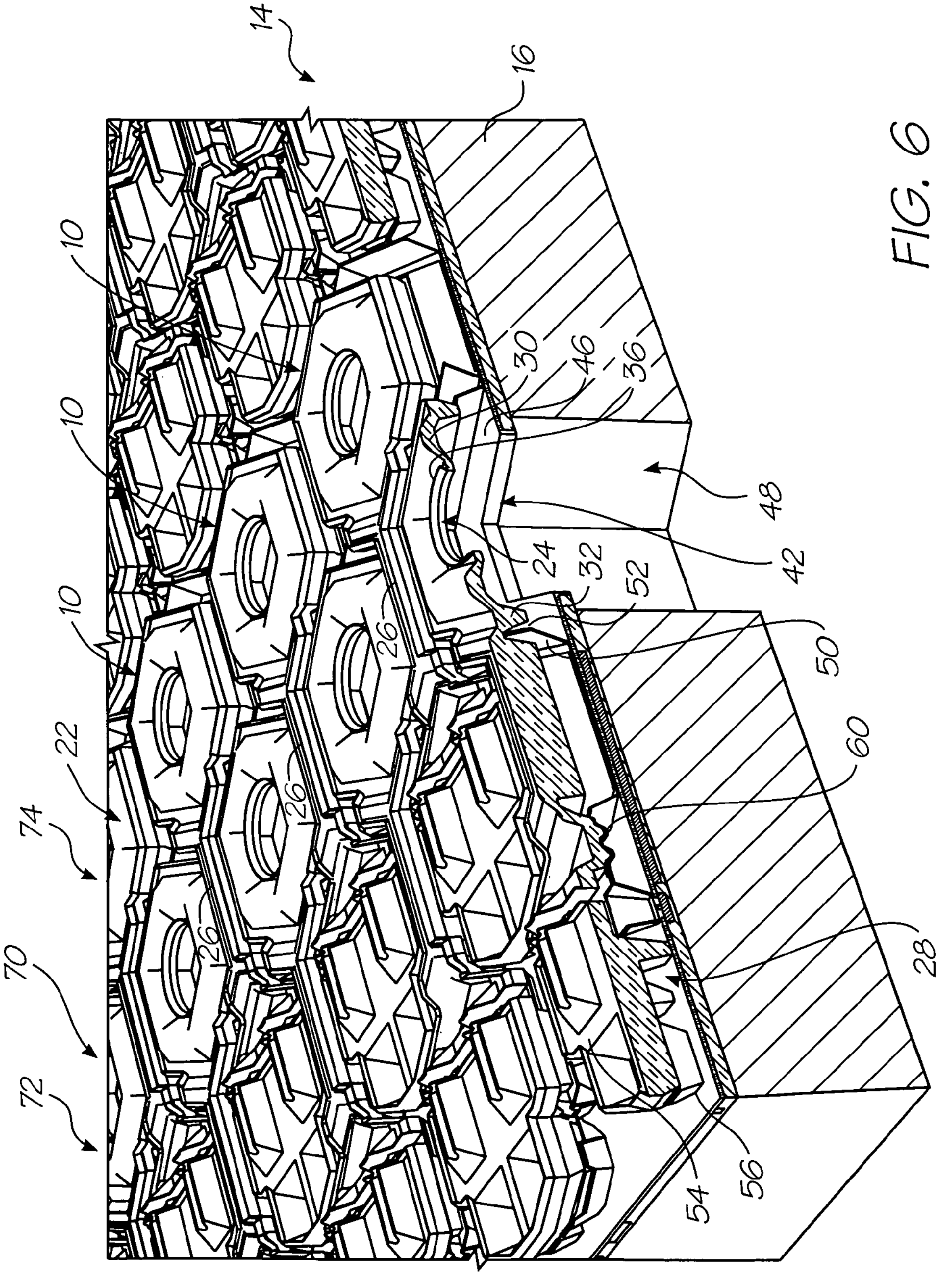
FIG. 6 shows, on an enlarged scale, part of the array of FIG. 5.

Referring now to FIGS. 5 and 6 of the drawings, the nozzle array 14 is described in greater detail. The array 14 is for a four color printhead. Accordingly, the array 14 includes four groups 70 of nozzle assemblies, one for each color. Each group 70 has its nozzle assemblies 10 arranged in two rows 72 and 74. One of the groups 70 is shown in greater detail in FIG. 6.

To facilitate close packing of the nozzle assemblies 10 in the rows 72 and 74, the nozzle assemblies 10 in the row 74 are offset or staggered with respect to the nozzle assemblies 10 in the row 72. Also, the nozzle assemblies 10 in the row 72 are spaced apart sufficiently far from each other to enable the lever arms 26 of the nozzle assemblies 10 in the row 74 to pass between adjacent nozzles 22 of the assemblies 10 in the row 72. It is to be noted that each nozzle assembly 10 is substantially dumbbell shaped so that the nozzles 22 in the row 72 nest between the nozzles 22 and the actuators 28 of adjacent nozzle assemblies 10 in the row 74.

Further, to facilitate close packing of the nozzles 22 in the rows 72 and 74, each nozzle 22 is substantially hexagonally shaped.

It will be appreciated by those skilled in the art that, when the nozzles 22 are displaced towards the substrate 16, in use, due to the nozzle opening 24 being at a slight angle with respect to the nozzle chamber 34 ink is ejected slightly off the perpendicular. It is an advantage of the arrangement shown in FIGS. 5 and 6 of the drawings that the actuators 28 of the nozzle assemblies 10 in the rows 72 and 74 extend in the same direction to one side of the rows 72 and 74. Hence, the ink ejected from the nozzles 22 in the row 72 and the ink ejected from the nozzles 22 in the row 74 are offset with respect to each other by the same angle resulting in an improved print quality.

Also, as shown in FIG. 5 of the drawings, the substrate 16 has bond pads 76 arranged thereon which provide the electrical connections, via the pads 56, to the actuators 28 of the nozzle assemblies 10. These electrical connections are formed via the CMOS layer (not shown).

Figure 7:
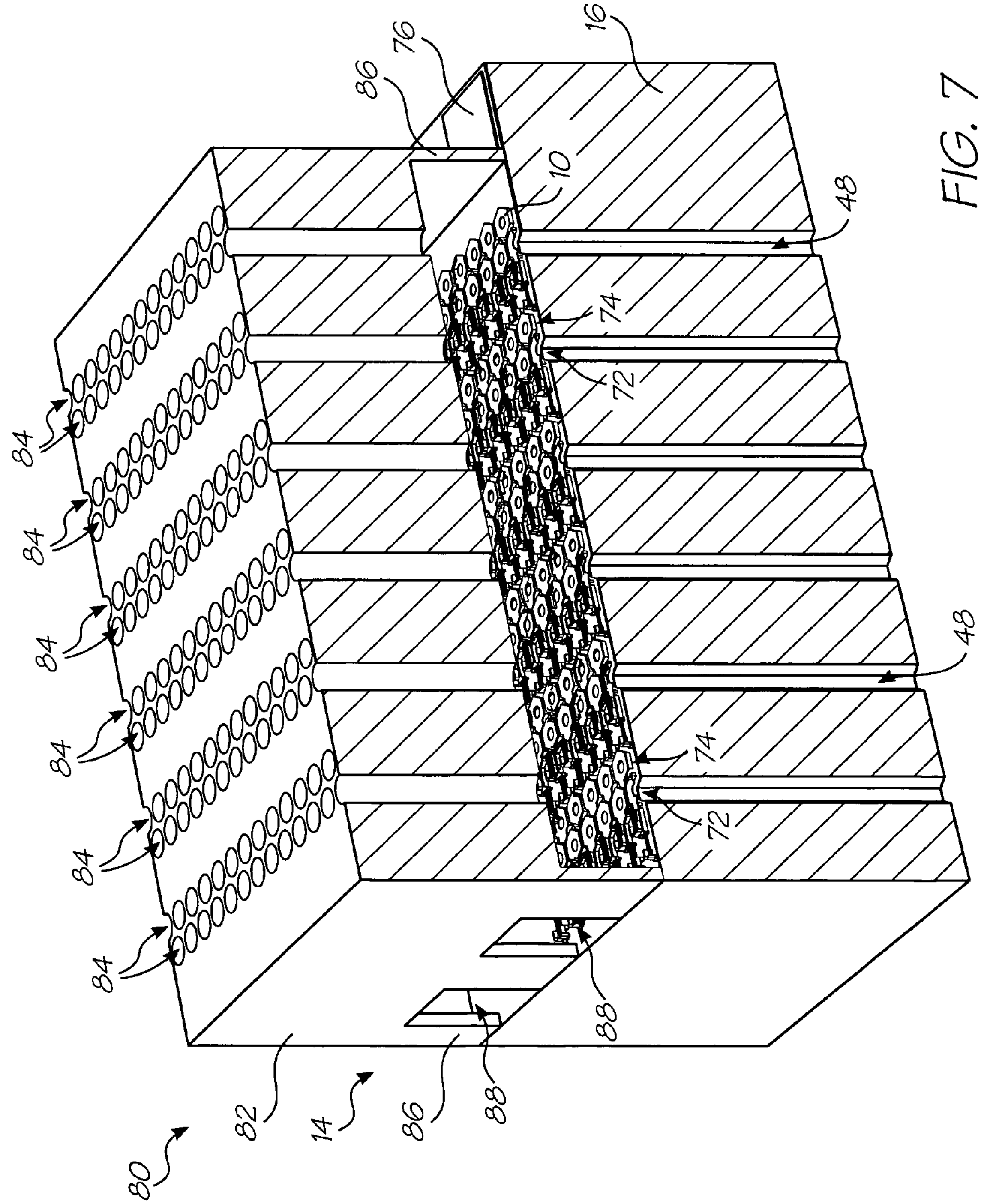
FIG. 7 shows a three dimensional view of an ink jet printhead including a nozzle guard, in accordance with the invention.

Referring to FIG. 7, a nozzle guard according to the present invention is shown. With reference to the previous drawings, like reference numerals refer to like parts, unless otherwise specified.

A nozzle guard 80 is mounted on the silicon substrate 16 of the array 14. The nozzle guard 80 includes a shield 82 having a plurality of passages 84 defined therethrough. The passages 84 are in register with the nozzle openings 24 of the nozzle assemblies 10 of the array 14 such that, when ink is ejected from any one of the nozzle openings 24, the ink passes through the associated passage before striking the print media.

The guard 80 is silicon so that it has the necessary strength and rigidity to protect the nozzle array 14 from damaging contact with paper, dust or the users' fingers. By forming the guard from silicon, its coefficient of thermal expansion substantially matches that of the nozzle array. This aims to prevent the passages 84 in the shield 82 from falling out of register with the nozzle array 14 as the printhead heats up to its normal operating temperature. Silicon is also well suited to accurate micro-machining using MEMS techniques discussed in greater detail below in relation to the manufacture of the nozzle assemblies 10.

The shield 82 is mounted in spaced relationship relative to the nozzle assemblies 10 by limbs or struts 86. One of the struts 86 has air inlet openings 88 defined therein.

In use, when the array 14 is in operation, air is charged through the inlet openings 88 to be forced through the passages 84 together with ink traveling through the passages 84.

The ink is not entrained in the air as the air is charged through the passages 84 at a different velocity from that of the ink droplets 64. For example, the ink droplets 64 are ejected from the nozzles 22 at a velocity of approximately 3 m/s. The air is charged through the passages 84 at a velocity of approximately 1 m/s.

The purpose of the air is to maintain the passages 84 clear of foreign particles. A danger exists that these foreign particles, such as dust particles, could fall onto the nozzle assemblies 10 adversely affecting their operation. With the provision of the air inlet openings 88 in the nozzle guard 80 this problem is, to a large extent, obviated.

Referring now to FIGS. 8 to 10 of the drawings, a process for manufacturing the nozzle assemblies 10 is described.

Starting with the silicon substrate or wafer 16, the dielectric layer 18 is deposited on a surface of the wafer 16. The dielectric layer 18 is in the form of approximately 1.5 microns of CVD oxide. Resist is spun on to the layer 18 and the layer 18 is exposed to mask 100 and is subsequently developed.

After being developed, the layer 18 is plasma etched down to the silicon layer 16. The resist is then stripped and the layer 18 is cleaned. This step defines the ink inlet aperture 42.

Figure 8A:
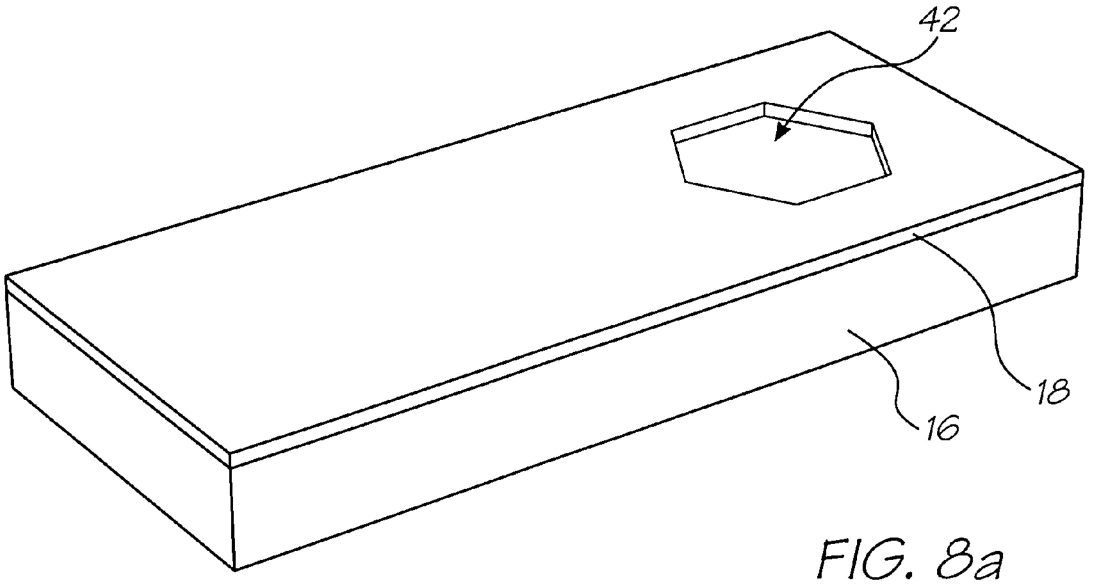
FIGS. 8*a* to 8*r* show three dimensional views of steps in the manufacture of a nozzle assembly of an ink jet printhead.
Figure 9A:
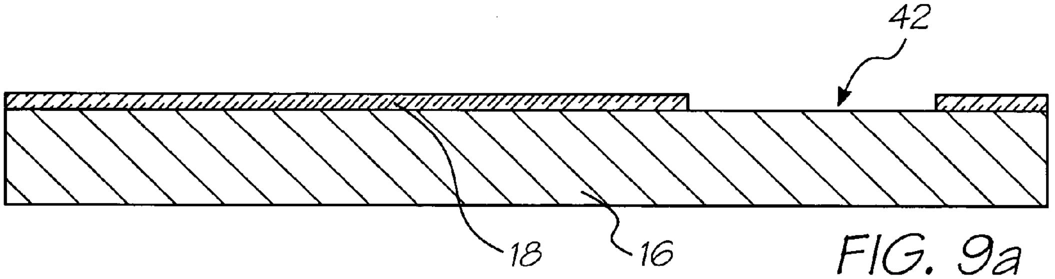
FIGS. 9*a* to 9*r* show sectional side views of the manufacturing steps.
Figure 10A:
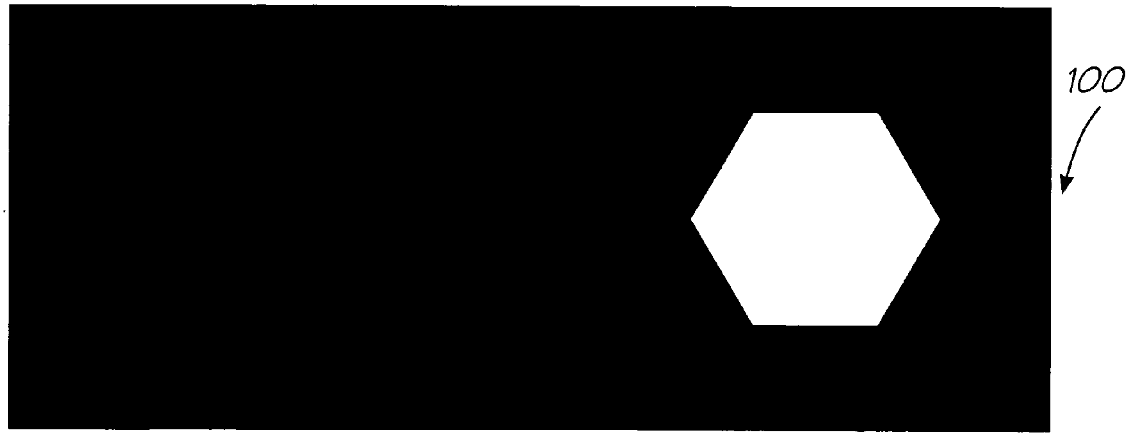
FIGS. 10*a* to 10*k* show layouts of masks used in various steps in the manufacturing process.
Figure 8B:
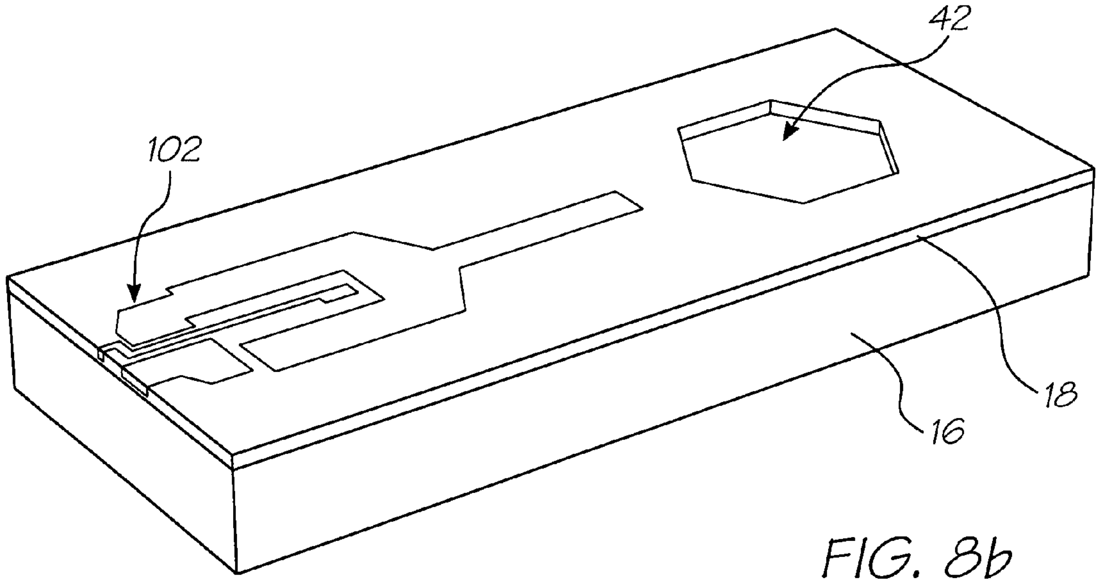
Figure 9B:
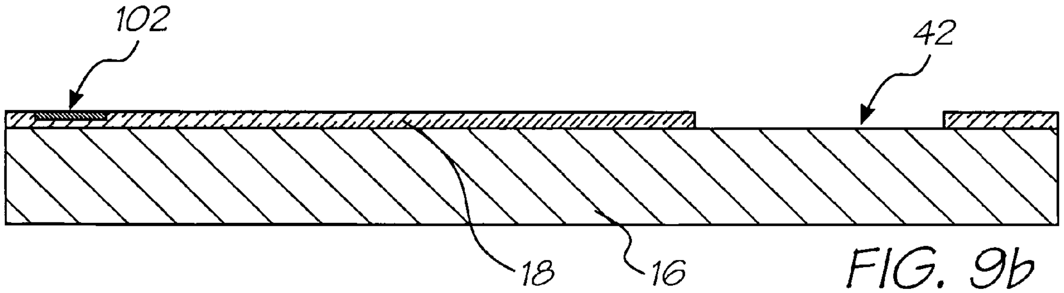
Figure 10B:
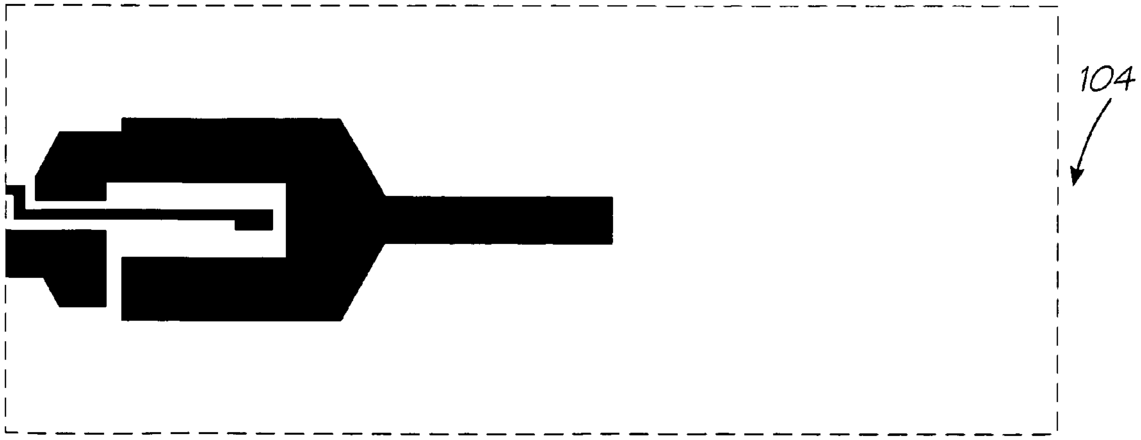
Figure 8C:
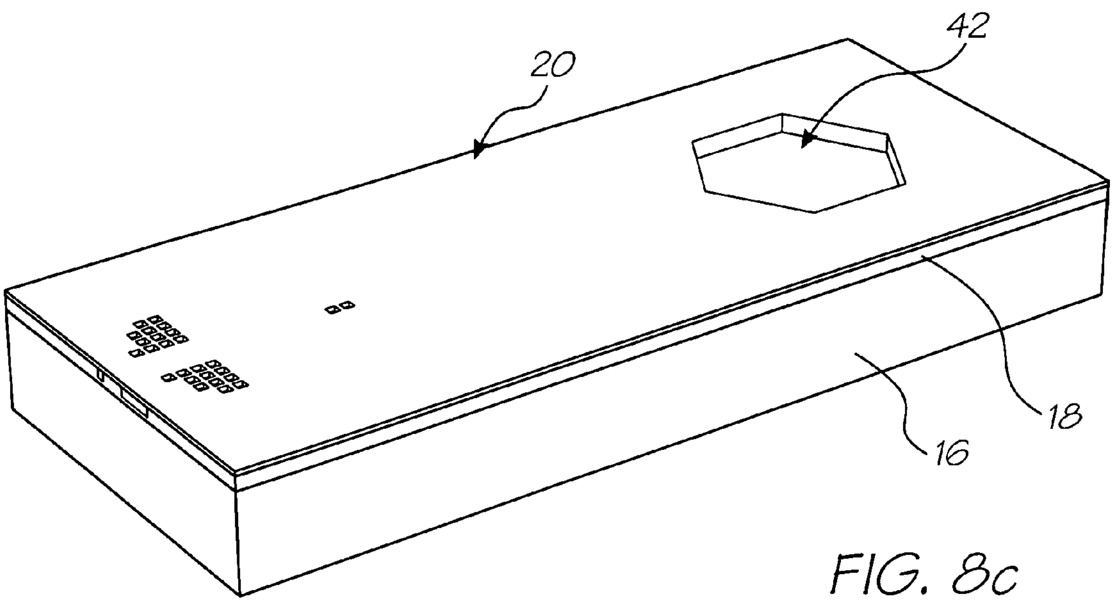
Figure 9C:
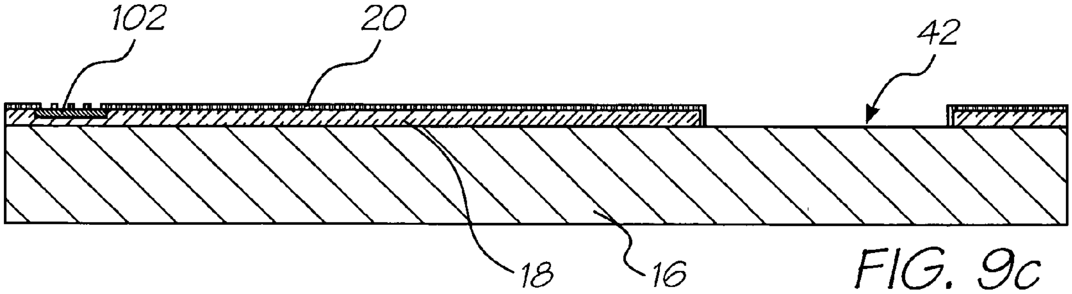
Figure 10C:
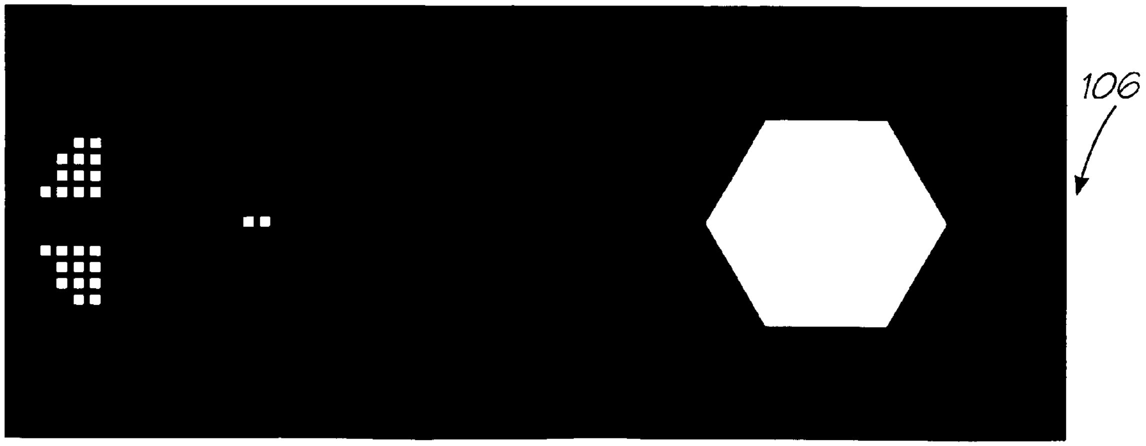
Figure 8D:
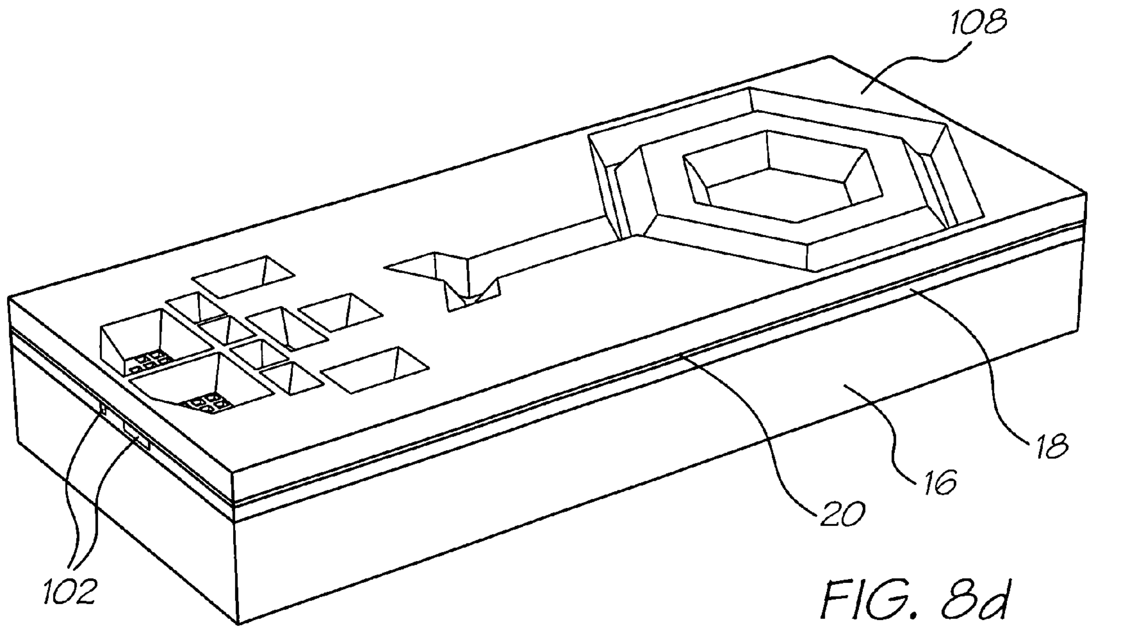
Figure 9D:
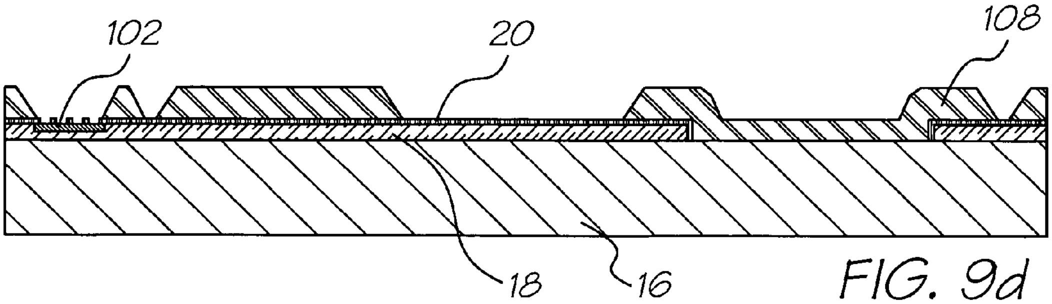
Figure 10D:
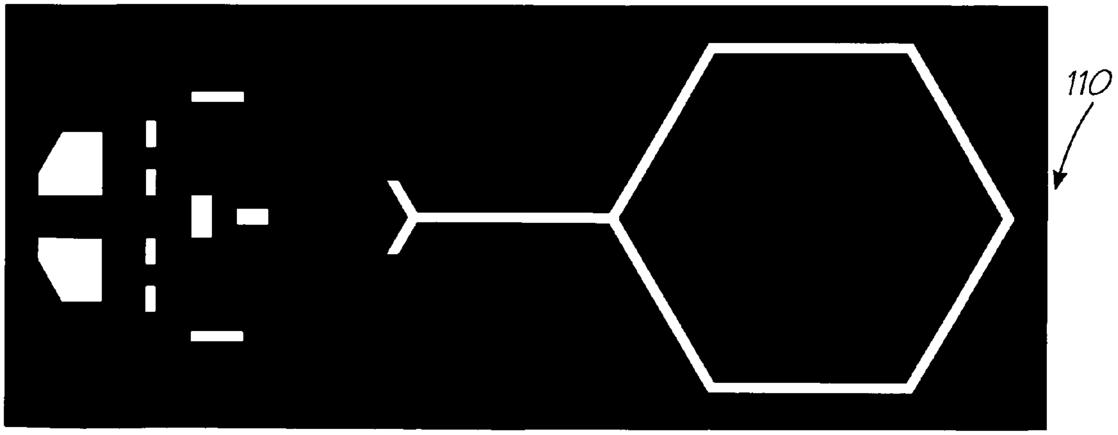

In FIG. 8*b* of the drawings, approximately 0.8 microns of aluminum 102 is deposited on the layer 18. Resist is spun on and the aluminum 102 is exposed to mask 104 and developed. The aluminum 102 is plasma etched down to the oxide layer 18, the resist is stripped and the device is cleaned. This step provides the bond pads and interconnects to the ink jet actuator 28. This interconnect is to an NMOS drive transistor and a power plane with connections made in the CMOS layer (not shown).

Approximately 0.5 microns of PECVD nitride is deposited as the CMOS passivation layer 20. Resist is spun on and the layer 20 is exposed to mask 106 whereafter it is developed. After development, the nitride is plasma etched down to the aluminum layer 102 and the silicon layer 16 in the region of the inlet aperture 42. The resist is stripped and the device cleaned.

A layer 108 of a sacrificial material is spun on to the layer 20. The layer 108 is 6 microns of photo-sensitive polyimide or approximately 4 μm of high temperature resist. The layer 108 is softbaked and is then exposed to mask 110 whereafter it is developed. The layer 108 is then hardbaked at 400° C. for one hour where the layer 108 is comprised of polyimide or at greater than 300° C. where the layer 108 is high temperature resist. It is to be noted in the drawings that the pattern-dependent distortion of the polyimide layer 108 caused by shrinkage is taken into account in the design of the mask 110.

Figure 8E:
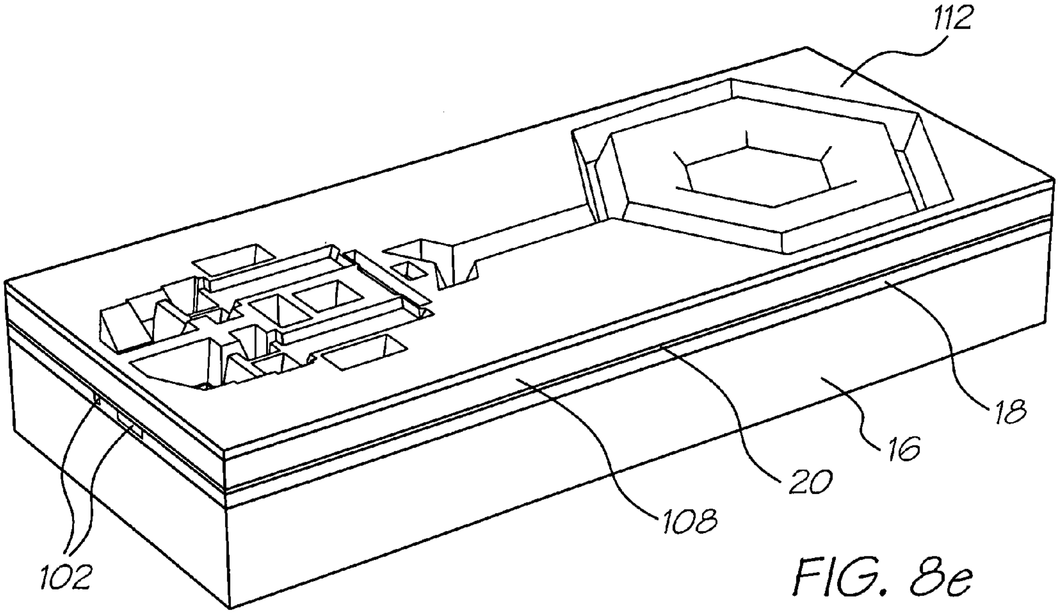
Figure 10E:
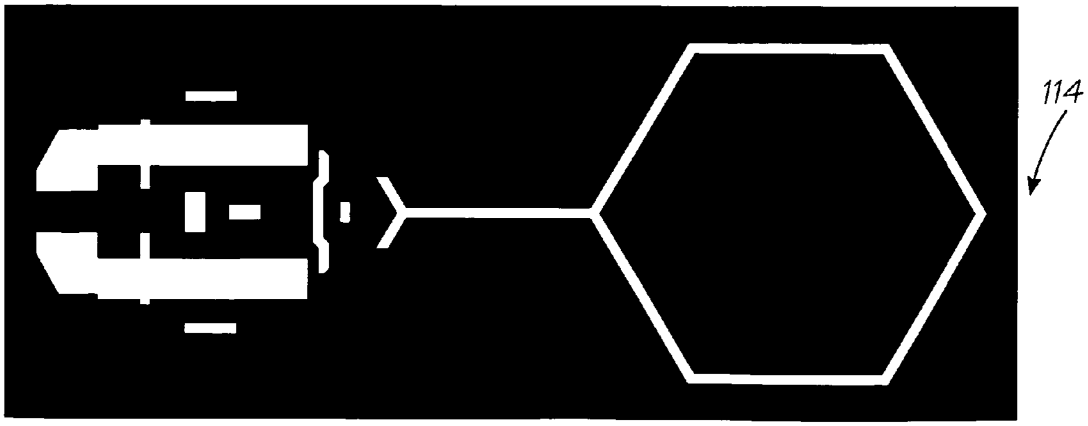
Figure 8F:
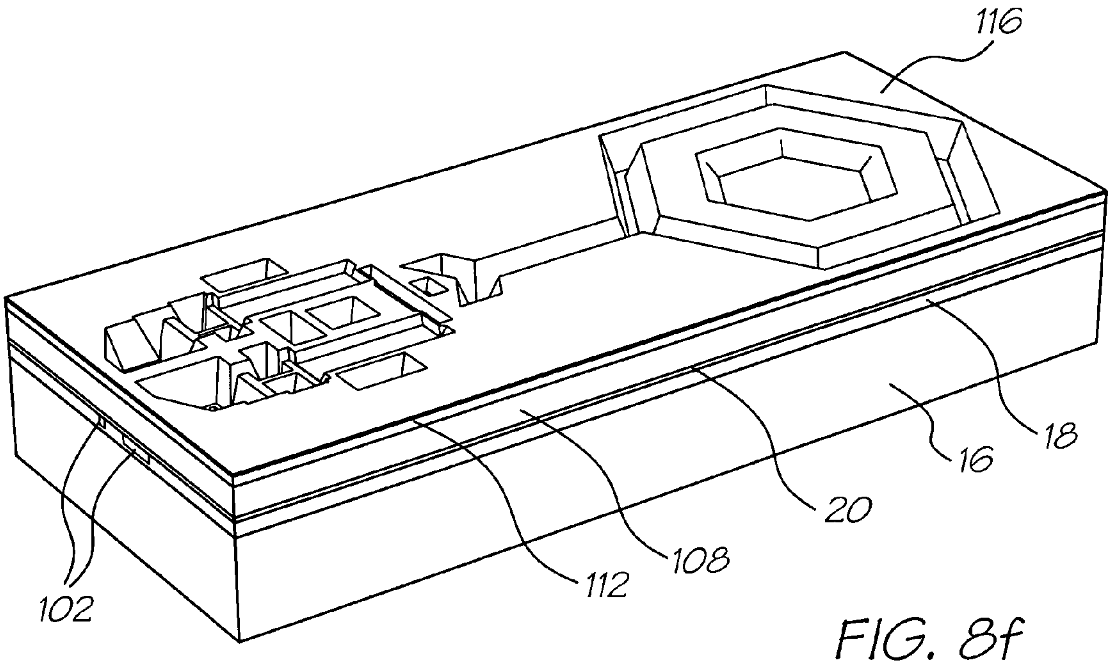
Figure 8G:
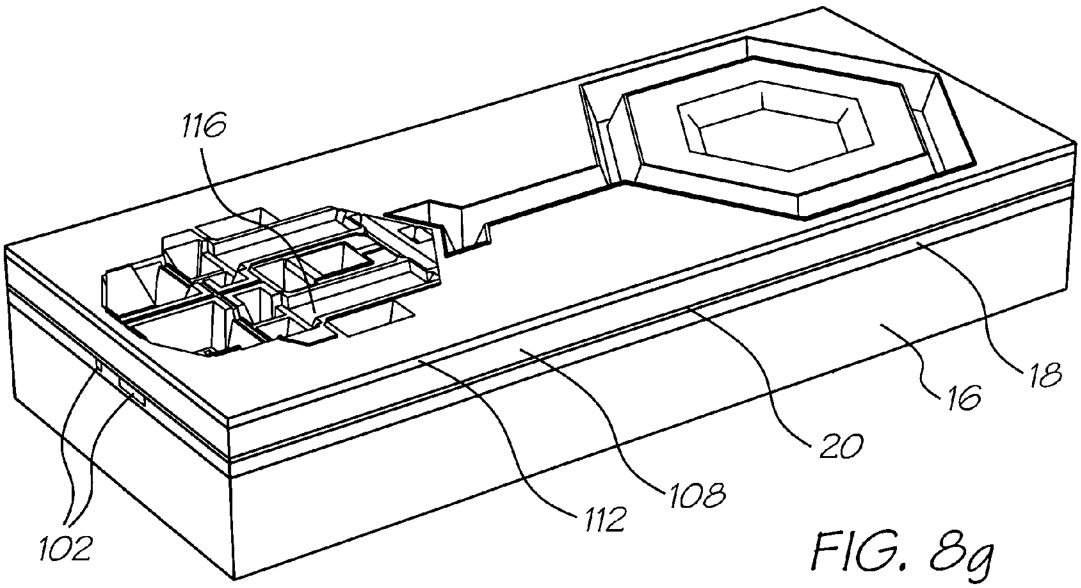
Figure 10F:
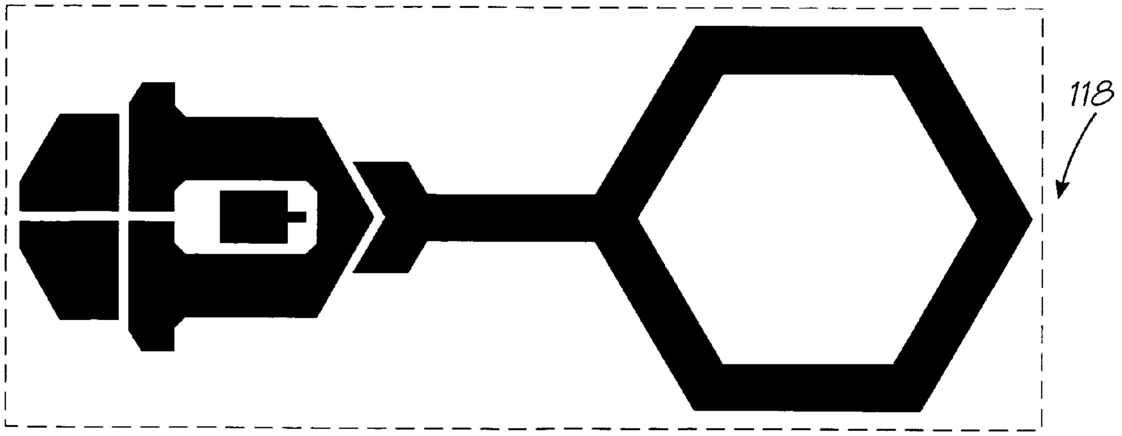
Figure 8H:
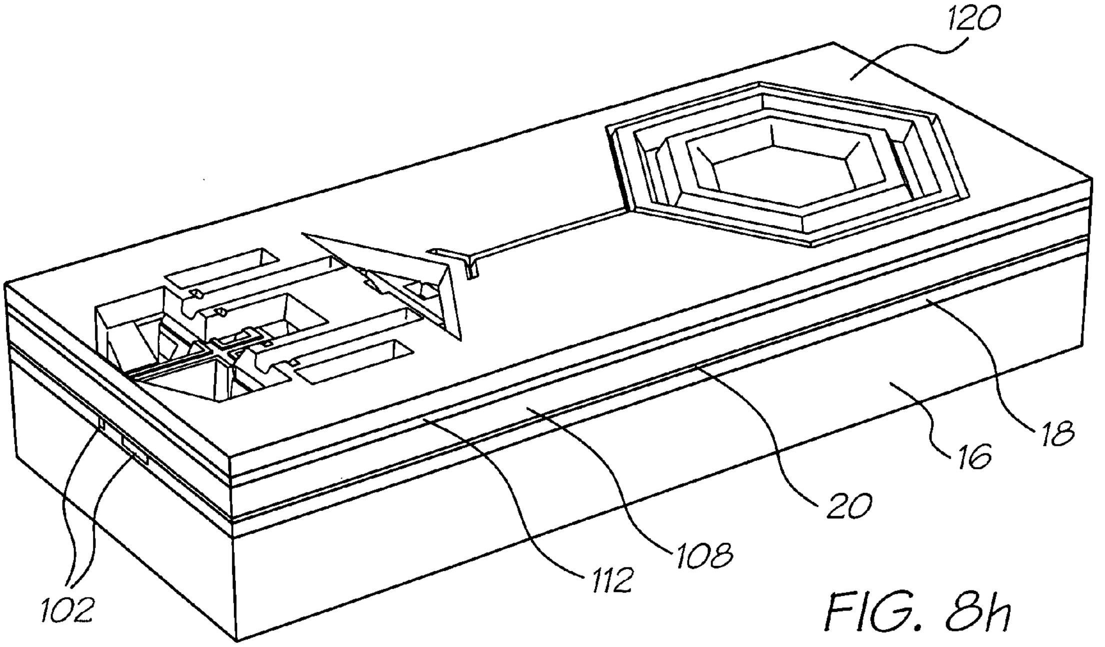
Figure 10G:
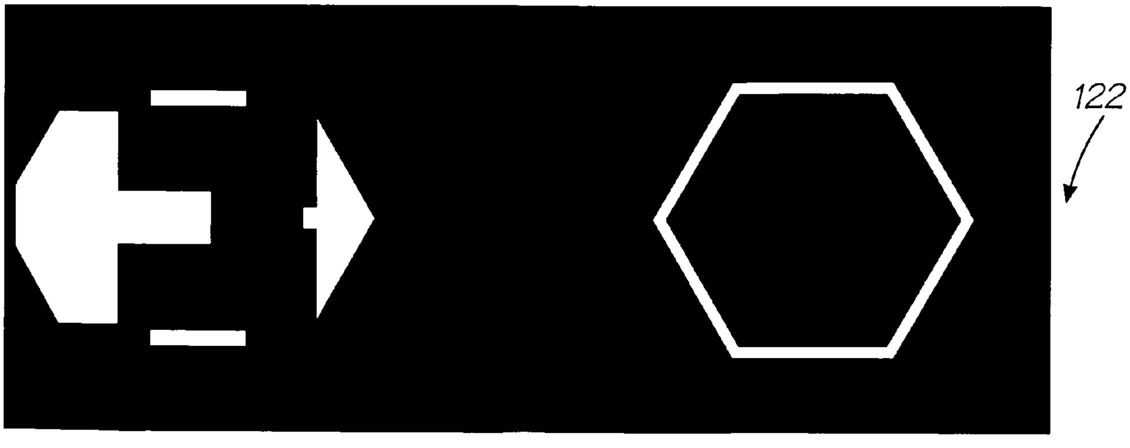
Figure 8I:
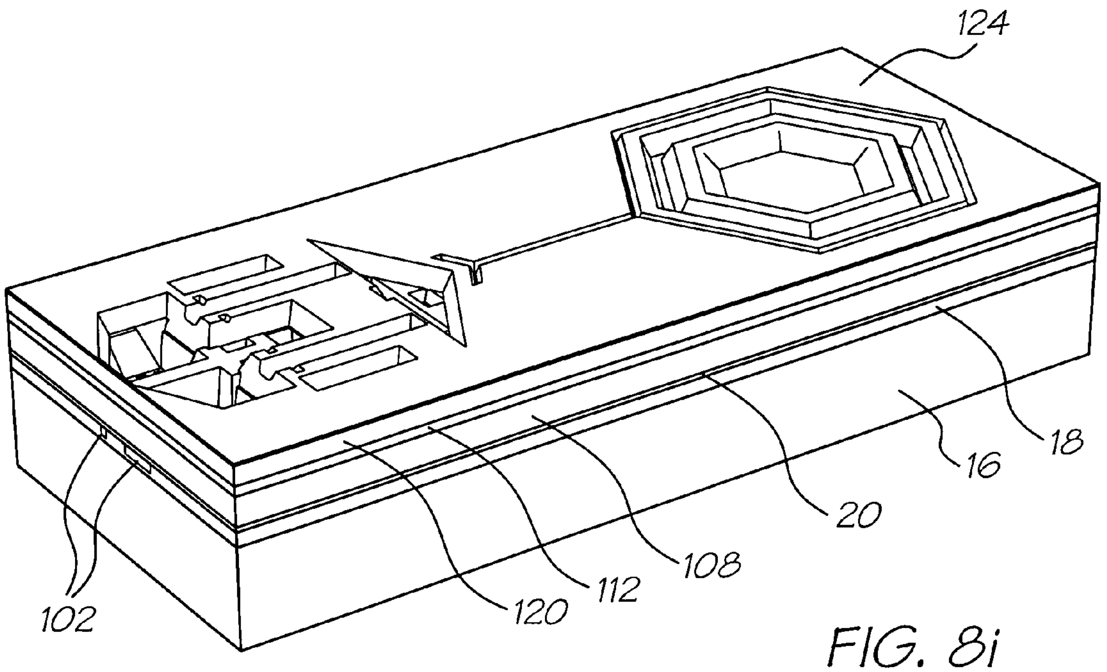
Figure 8J:
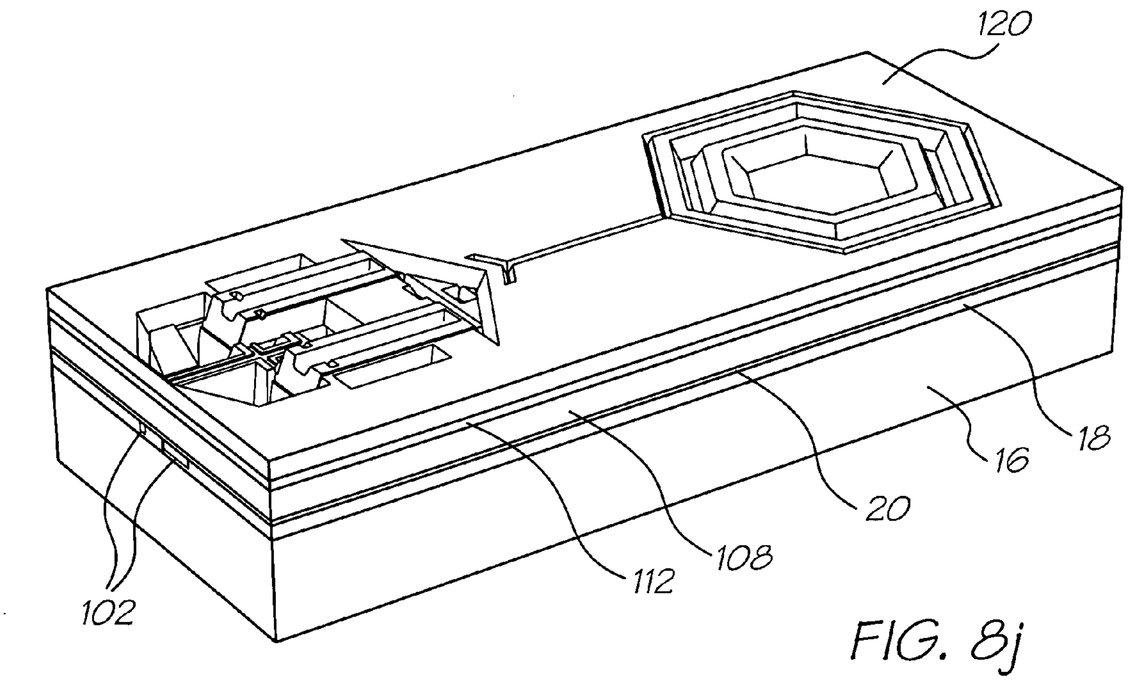
Figure 10H:
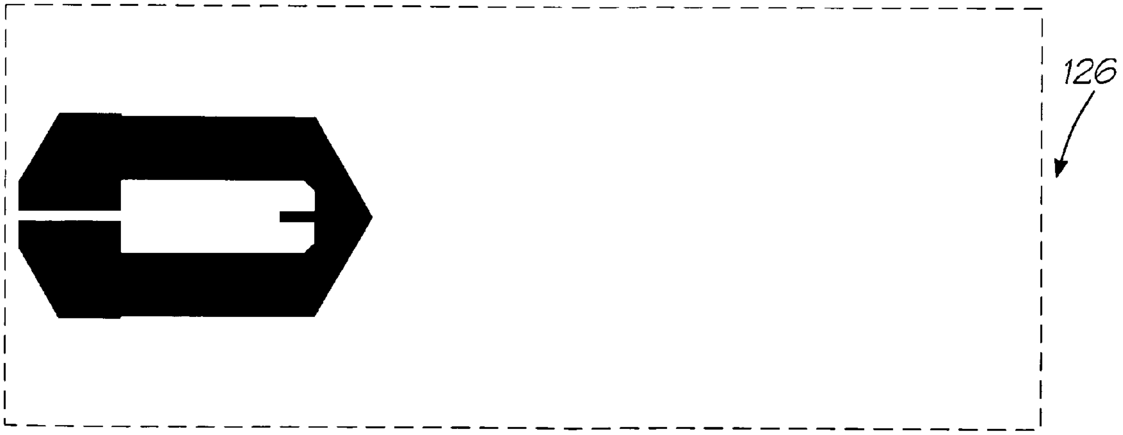
Figure 8K:
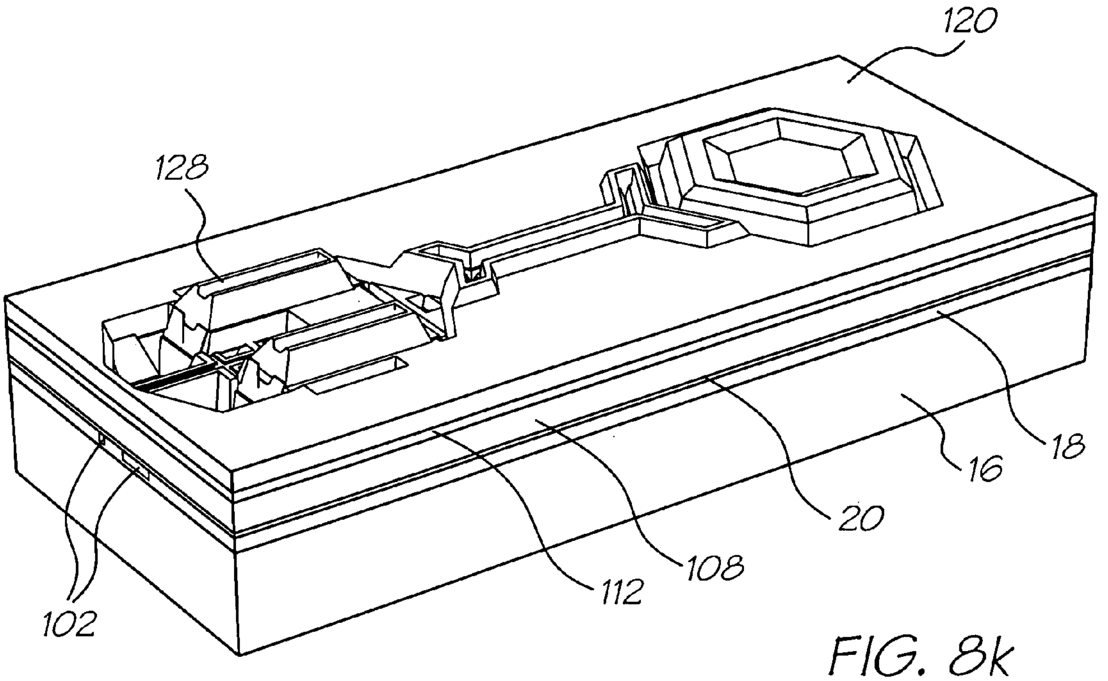

In the next step, shown in FIG. 8*e* of the drawings, a second sacrificial layer 112 is applied. The layer 112 is either 2 μm of photo-sensitive polyimide which is spun on or approximately 1.3 μm of high temperature resist. The layer 112 is softbaked and exposed to mask 114. After exposure to the mask 114, the layer 112 is developed. In the case of the layer 112 being polyimide, the layer 112 is hardbaked at 400° C. for approximately one hour. Where the layer 112 is resist, it is hardbaked at greater than 300° C. for approximately one hour.

A 0.2 micron multi-layer metal layer 116 is then deposited. Part of this layer 116 forms the passive beam 60 of the actuator 28.

The layer 116 is formed by sputtering 1,000 Å of titanium nitride (TiN) at around 300° C. followed by sputtering 50 Å of tantalum nitride (TaN). A further 1,000 Å of TiN is sputtered on followed by 50 Å of TaN and a further 1,000 Å of TiN.

Other materials which can be used instead of TiN are $TiB_2$, $MoSi_2$ or (Ti, Al)N.

The layer 116 is then exposed to mask 118, developed and plasma etched down to the layer 112 whereafter resist, applied for the layer 116, is wet stripped taking care not to remove the cured layers 108 or 112.

A third sacrificial layer 120 is applied by spinning on 4 μm of photo-sensitive polyimide or approximately 2.6 μm high temperature resist. The layer 120 is softbaked whereafter it is exposed to mask 122. The exposed layer is then developed followed by hard baking. In the case of polyimide, the layer 120 is hardbaked at 400° C. for approximately one hour or at greater than 300° C. where the layer 120 comprises resist.

A second multi-layer metal layer 124 is applied to the layer 120. The constituents of the layer 124 are the same as the layer 116 and are applied in the same manner. It will be appreciated that both layers 116 and 124 are electrically conductive layers.

The layer 124 is exposed to mask 126 and is then developed. The layer 124 is plasma etched down to the polyimide or resist layer 120 whereafter resist applied for the layer 124 is wet stripped taking care not to remove the cured layers 108, 112 or 120. It will be noted that the remaining part of the layer 124 defines the active beam 58 of the actuator 28.

Figure 9E:
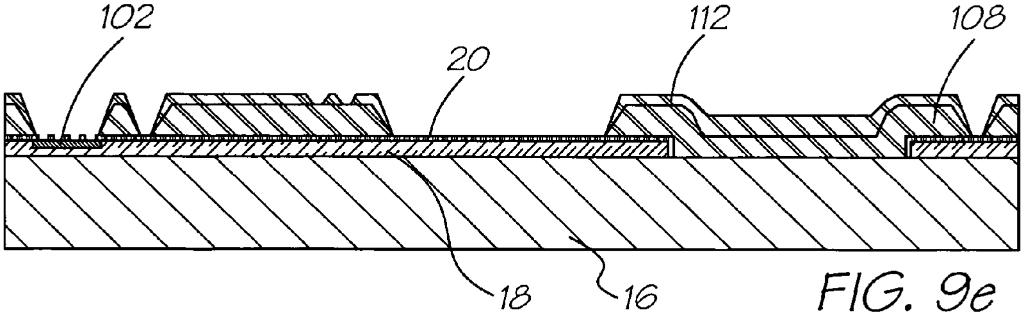
Figure 9F:
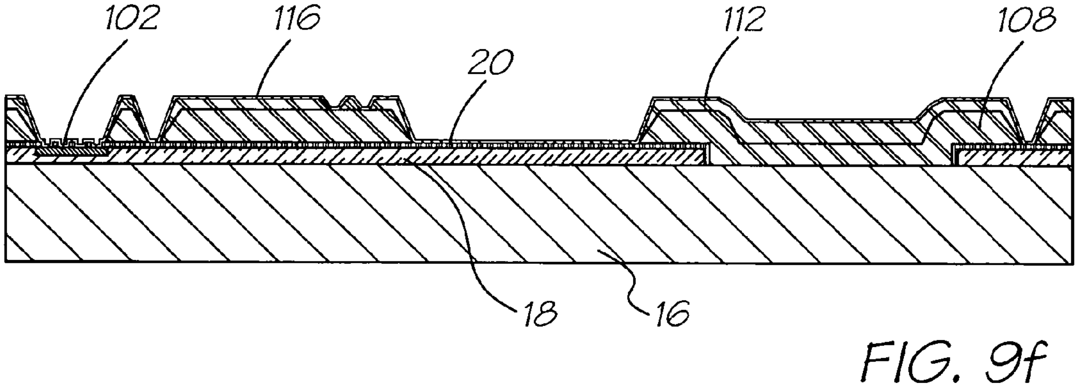
Figure 9G:
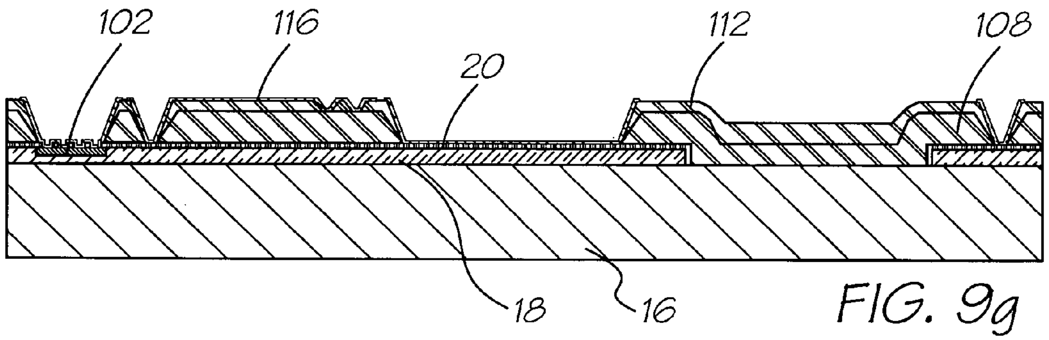
Figure 9H:
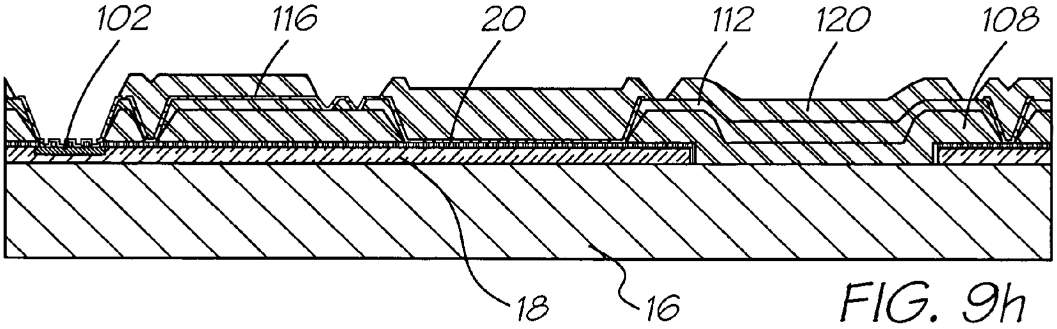
Figure 9I:
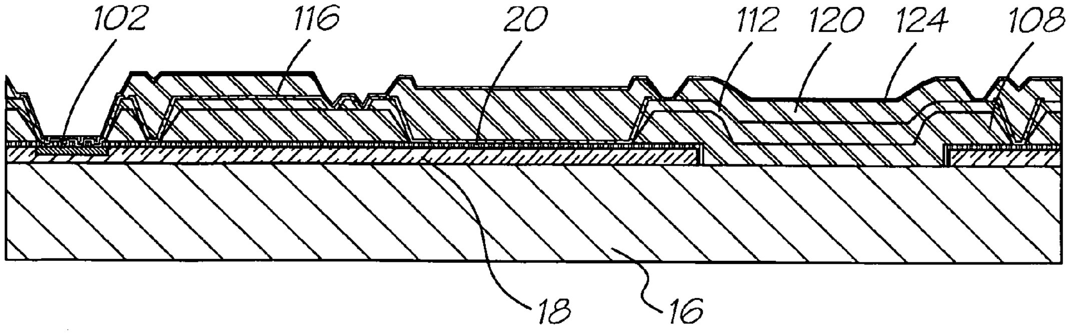
Figure 9J:
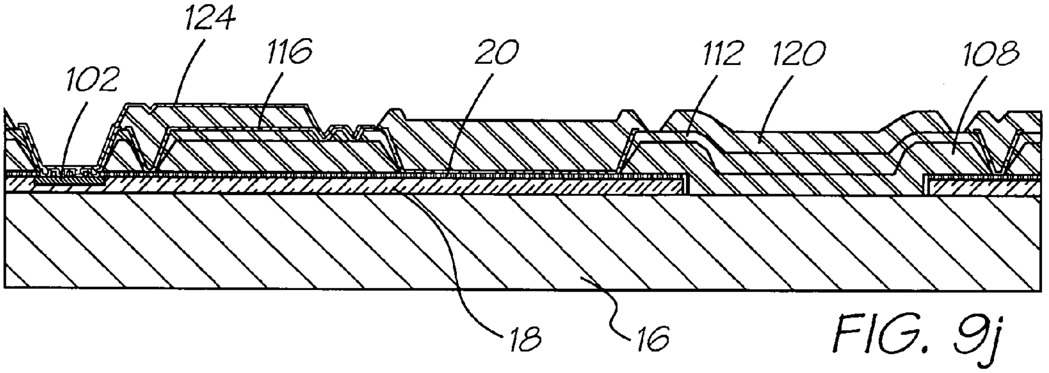
Figure 9K:
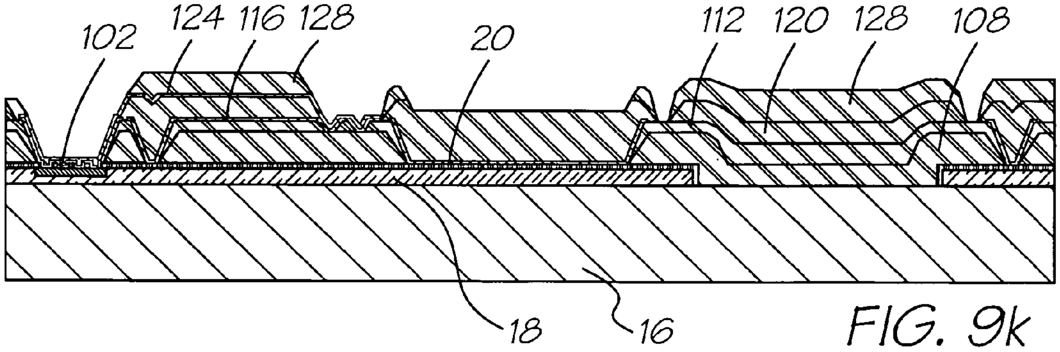
Figure 10I:
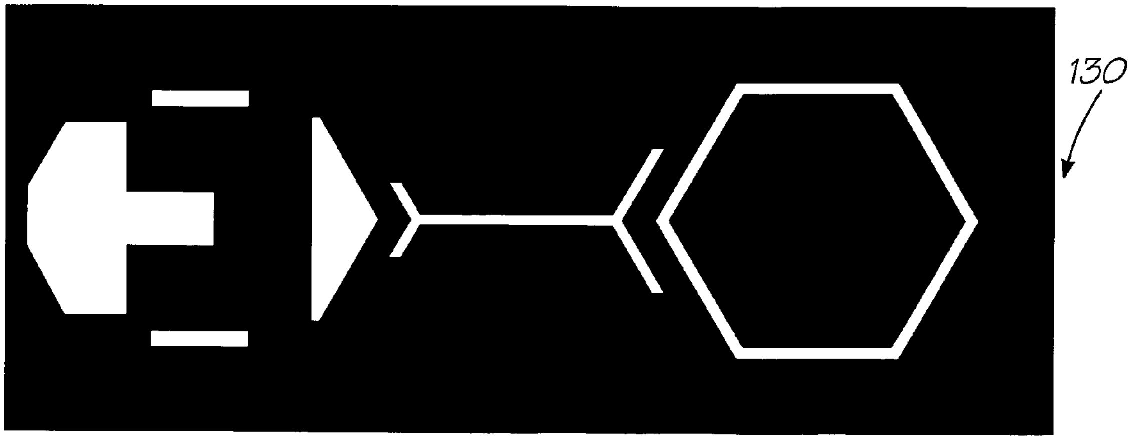
Figure 81:
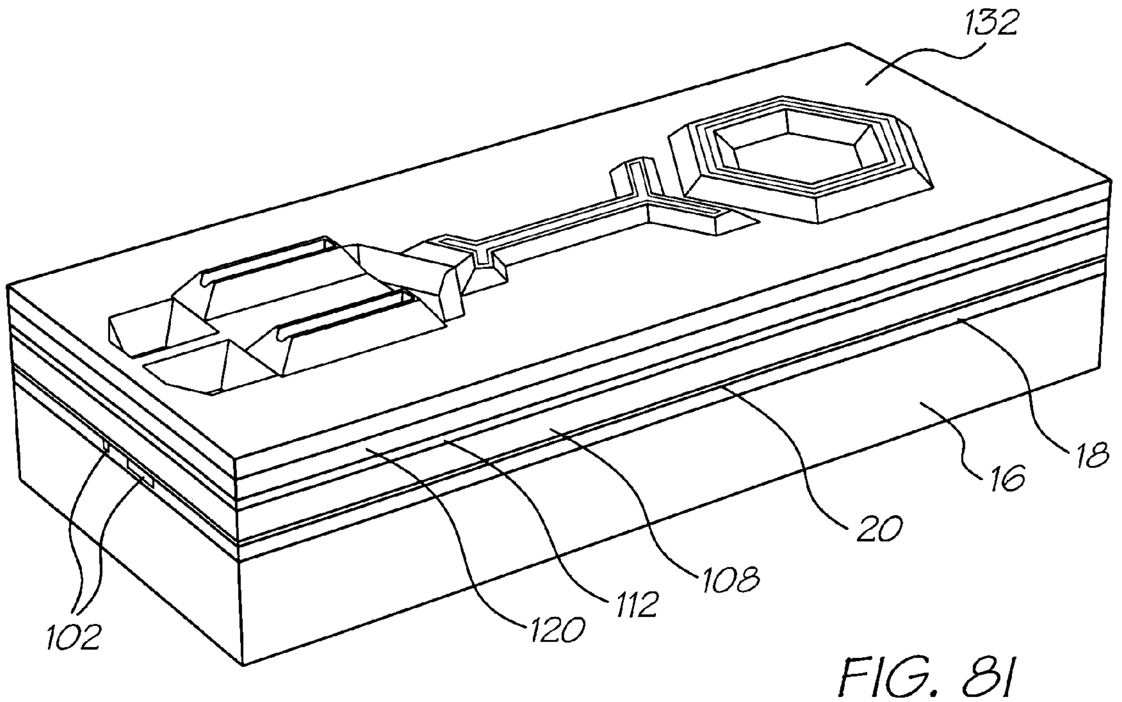
Figure 91:
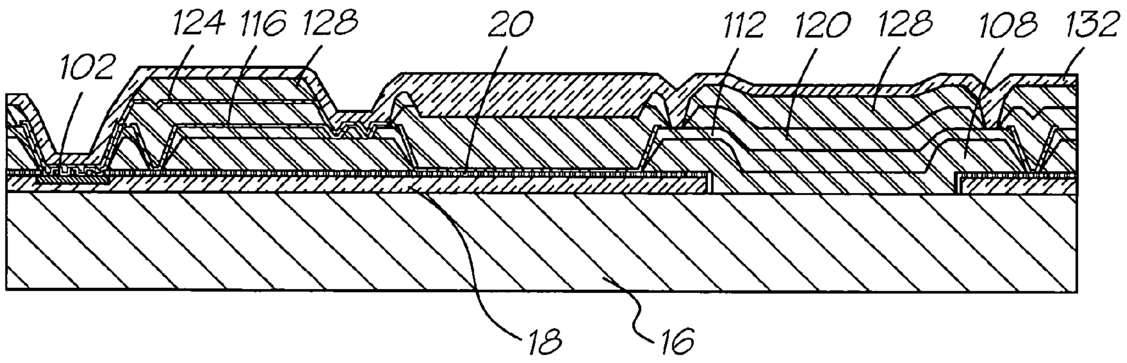
Figure 9M:
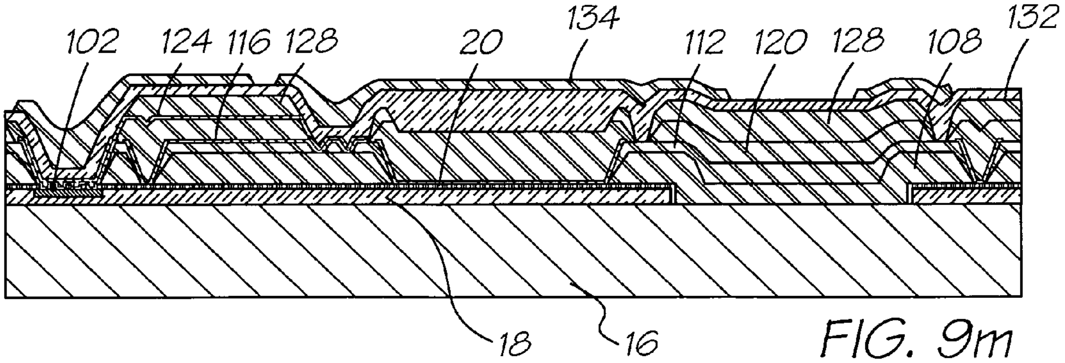
Figure 10J:
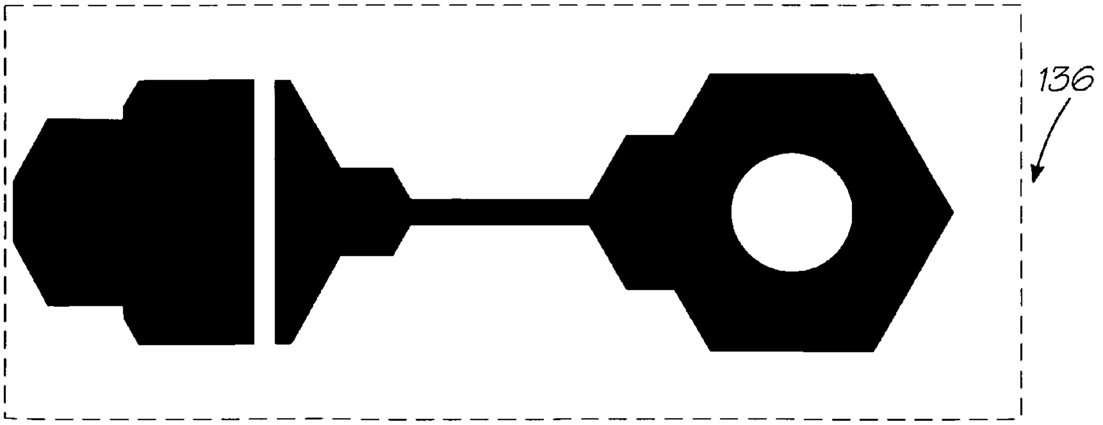
Figure 9N:
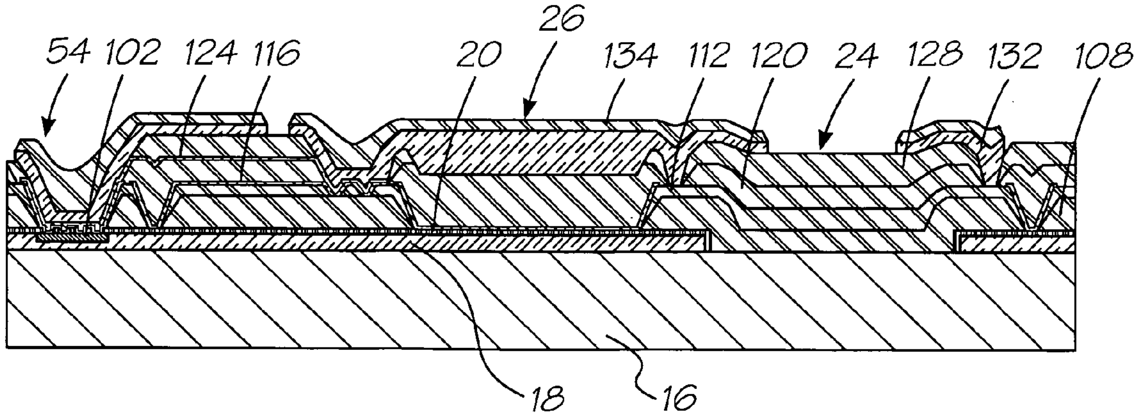
Figure 9O:
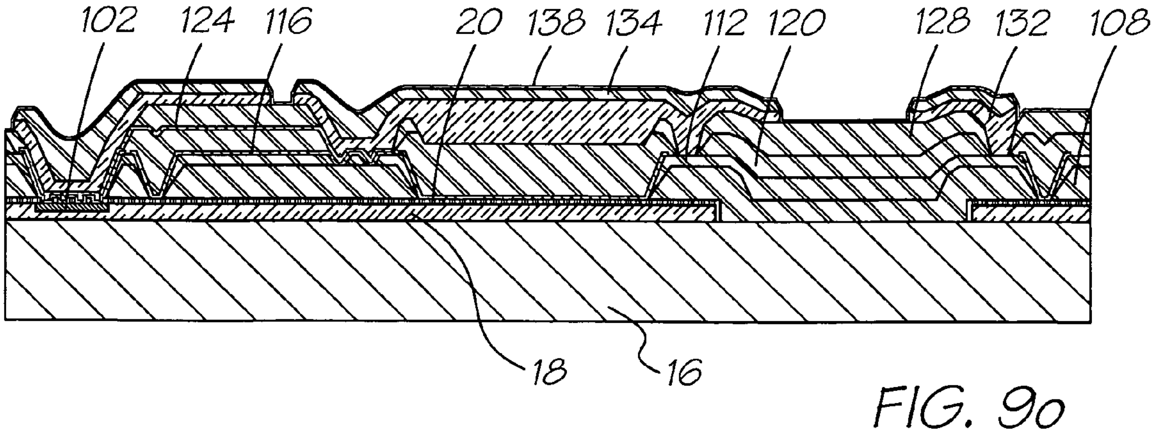

A fourth sacrificial layer 128 is applied by spinning on 4 μm of photo-sensitive polyimide or approximately 2.6 μm of high temperature resist. The layer 128 is softbaked, exposed to the mask 130 and is then developed to leave the island portions as shown in FIG. 9*k* of the drawings. The remaining portions of the layer 128 are hardbaked at 400° C. for approximately one hour in the case of polyimide or at greater than 300° C. for resist.

As shown in FIG. 8*l* of the drawing a high Young's modulus dielectric layer 132 is deposited. The layer 132 is constituted by approximately 1 μm of silicon nitride or aluminum oxide. The layer 132 is deposited at a temperature below the hardbaked temperature of the sacrificial layers 108, 112, 120, 128. The primary characteristics required for this dielectric layer 132 are a high elastic modulus, chemical inertness and good adhesion to TiN.

A fifth sacrificial layer 134 is applied by spinning on 2 μm of photo-sensitive polyimide or approximately 1.3 μm of high temperature resist. The layer 134 is softbaked, exposed to mask 136 and developed. The remaining portion of the layer 134 is then hardbaked at 400° C. for one hour in the case of the polyimide or at greater than 300° C. for the resist.

The dielectric layer 132 is plasma etched down to the sacrificial layer 128 taking care not to remove any of the sacrificial layer 134.

This step defines the nozzle opening 24, the lever arm 26 and the anchor 54 of the nozzle assembly 10.

A high Young's modulus dielectric layer 138 is deposited. This layer 138 is formed by depositing 0.2 μm of silicon nitride or aluminum nitride at a temperature below the hardbaked temperature of the sacrificial layers 108, 112, 120 and 128.

Figure 8M:
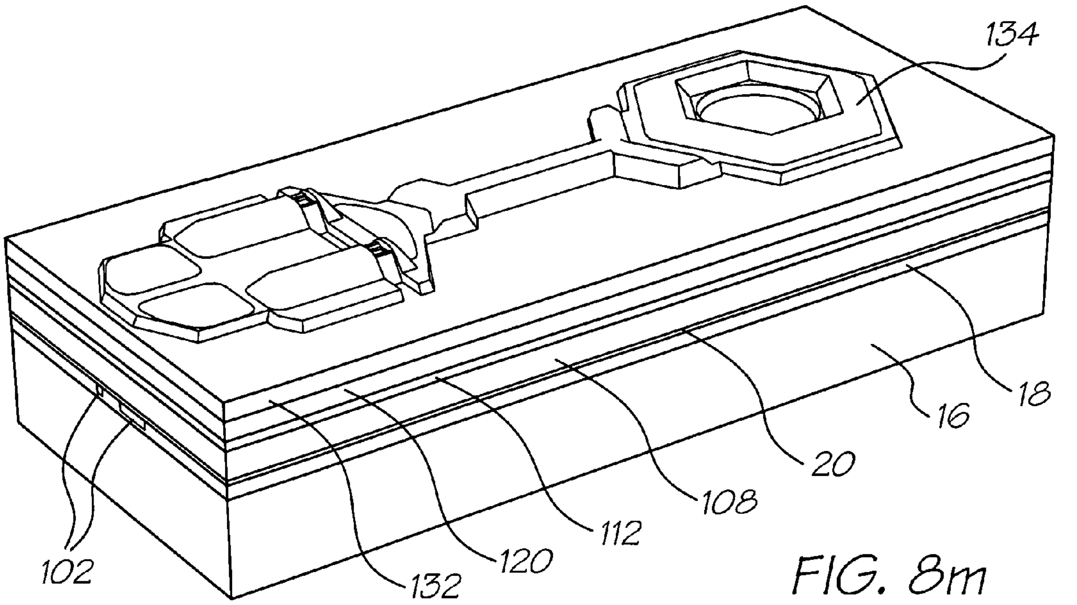
Figure 8N:
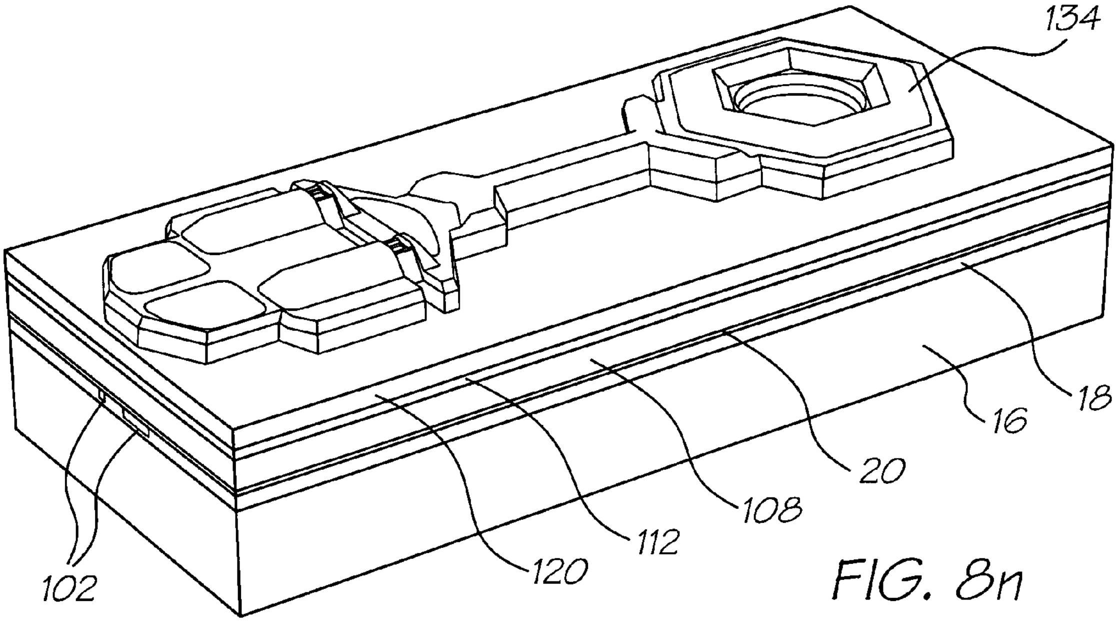
Figure 8O:
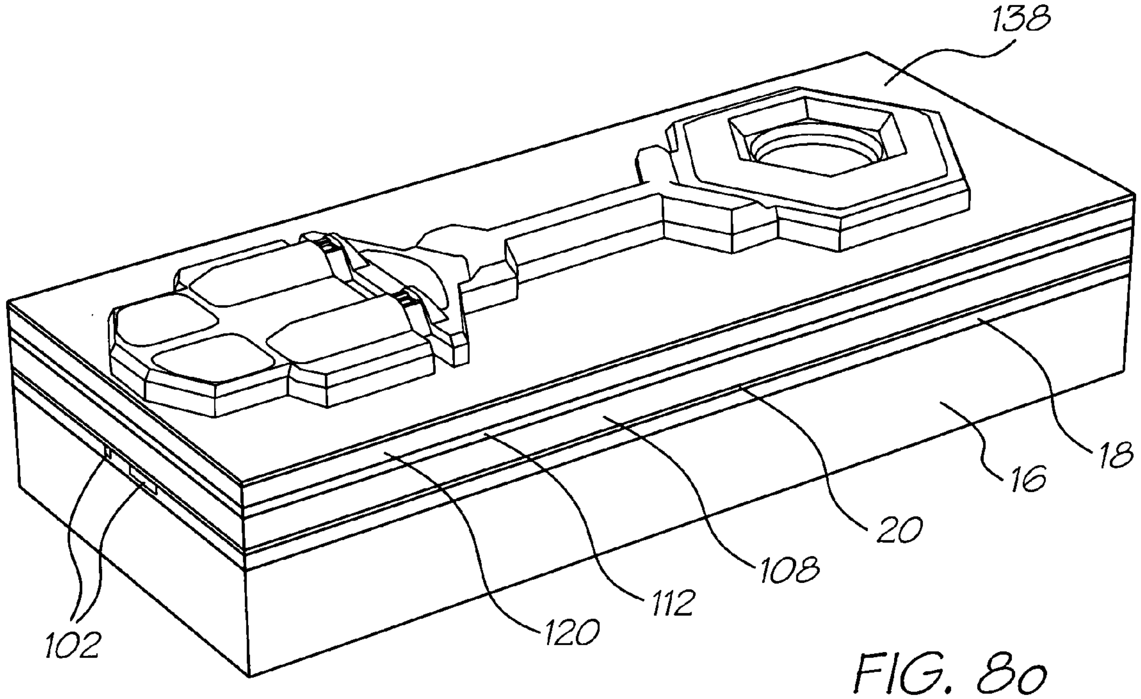
Figure 8P:
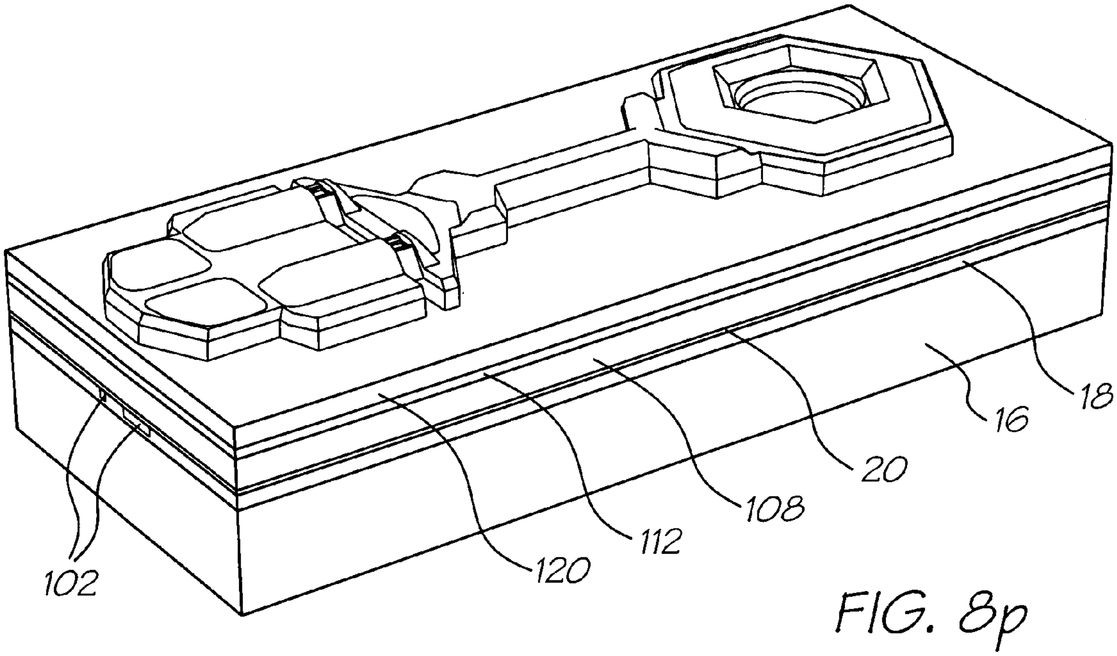
Figure 9P:
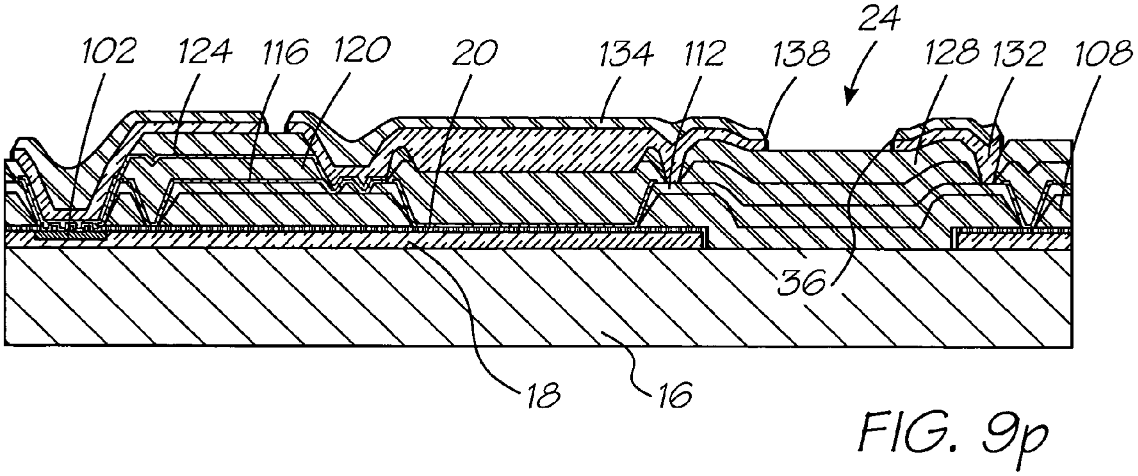
Figure 8Q:
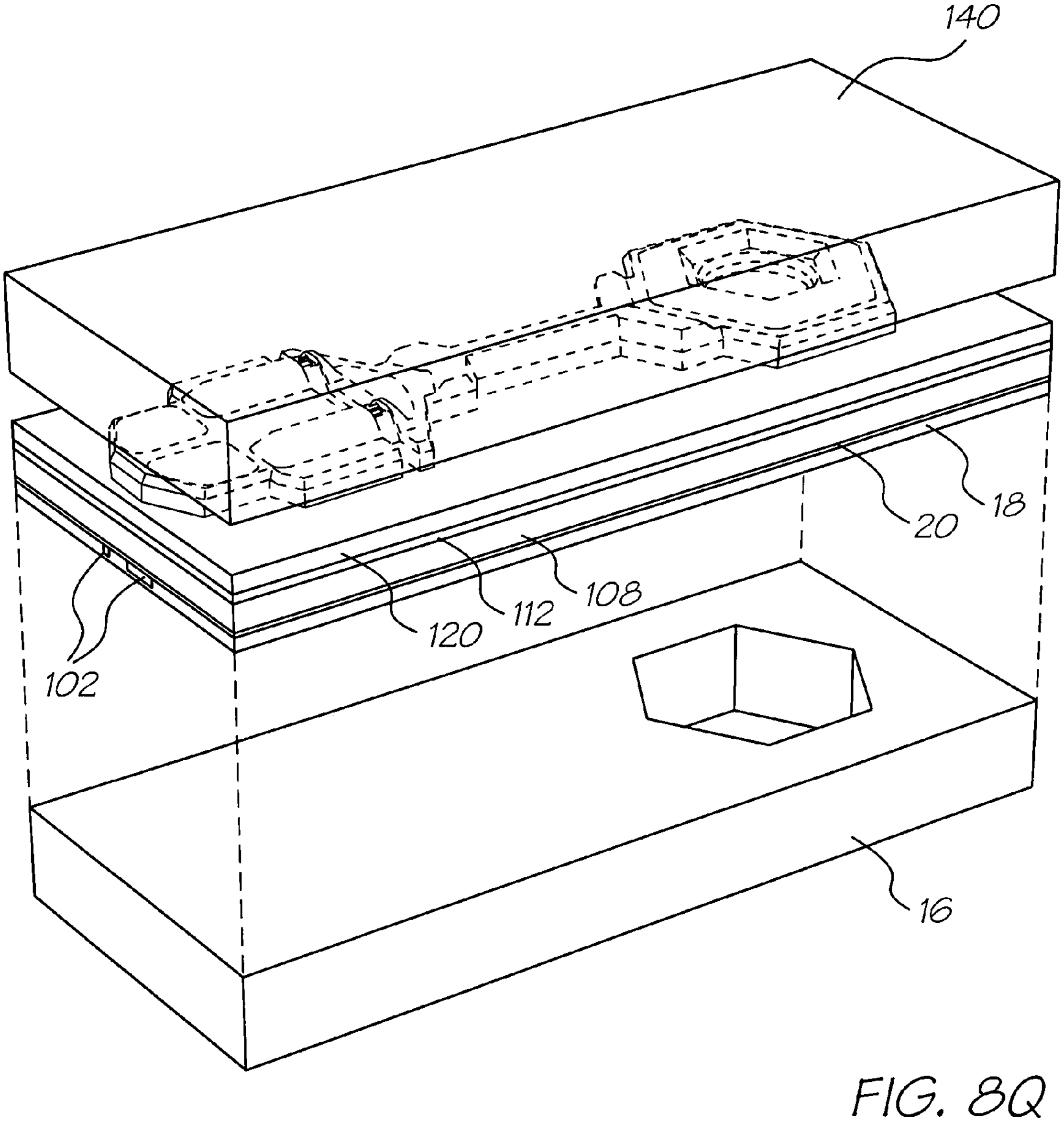

Then, as shown in FIG. 8*p* of the drawings, the layer 138 is anisotropically plasma etched to a depth of 0.35 microns. This etch is intended to clear the dielectric from all of the surface except the side walls of the dielectric layer 132 and the sacrificial layer 134. This step creates the nozzle rim 36 around the nozzle opening 24 which "pins" the meniscus of ink, as described above.

An ultraviolet (UV) release tape 140 is applied. 4 μm of resist is spun on to a rear of the silicon wafer 16. The wafer 16 is exposed to mask 142 to back etch the wafer 16 to define the ink inlet channel 48. The resist is then stripped from the wafer 16.

Figure 8R:
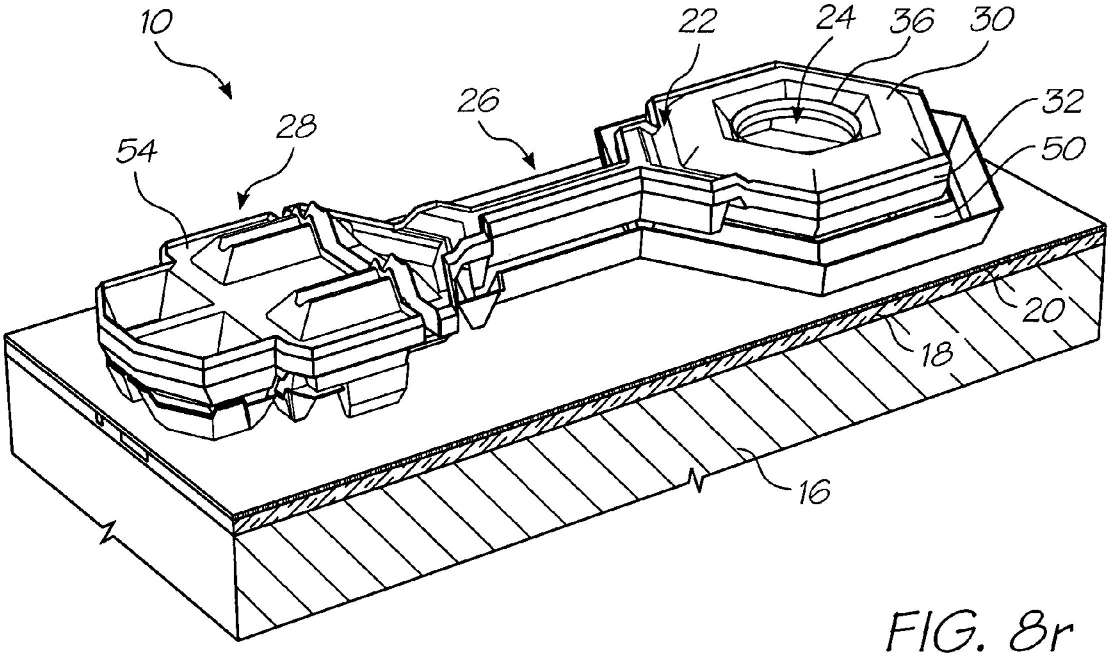
Figure 9R:
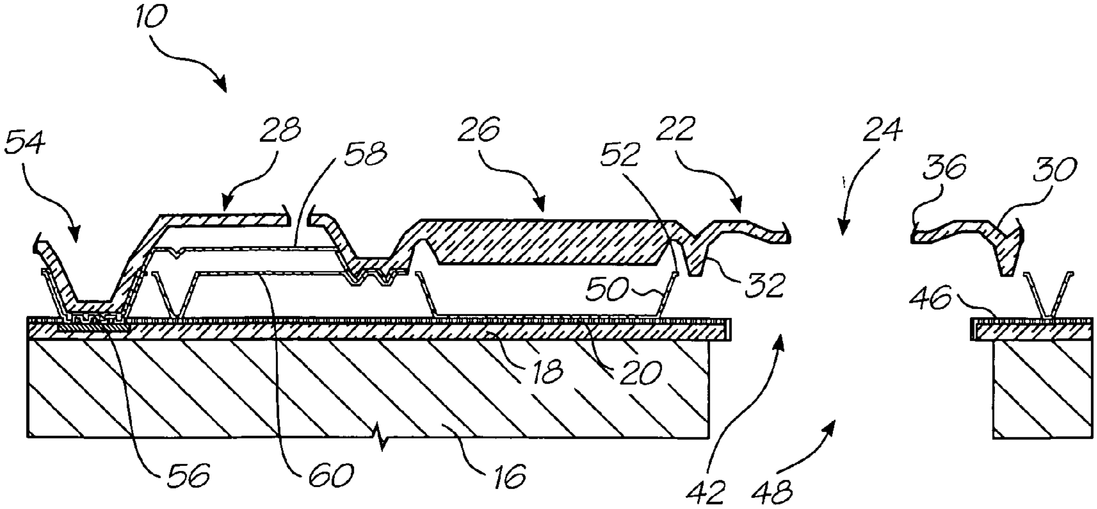
Figure 9Q:
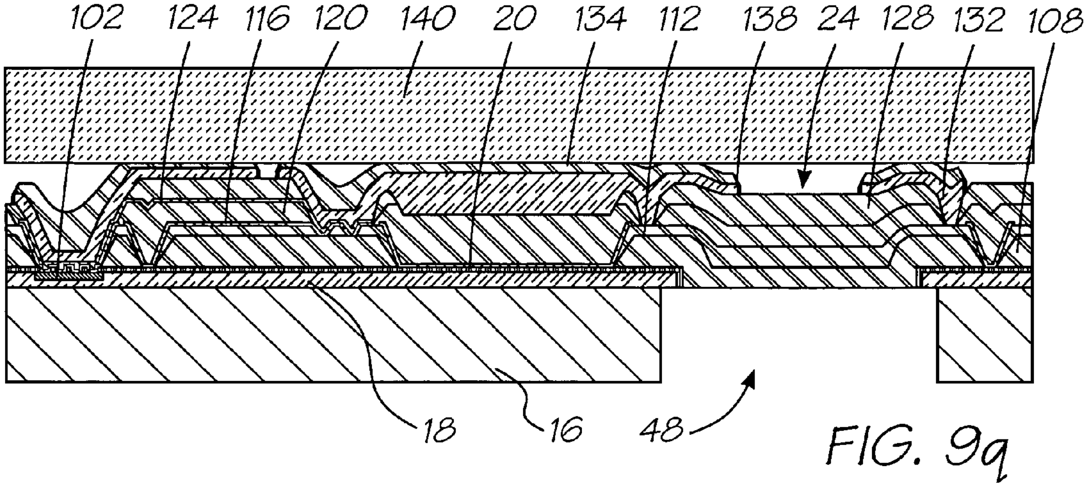
Figure 10K:
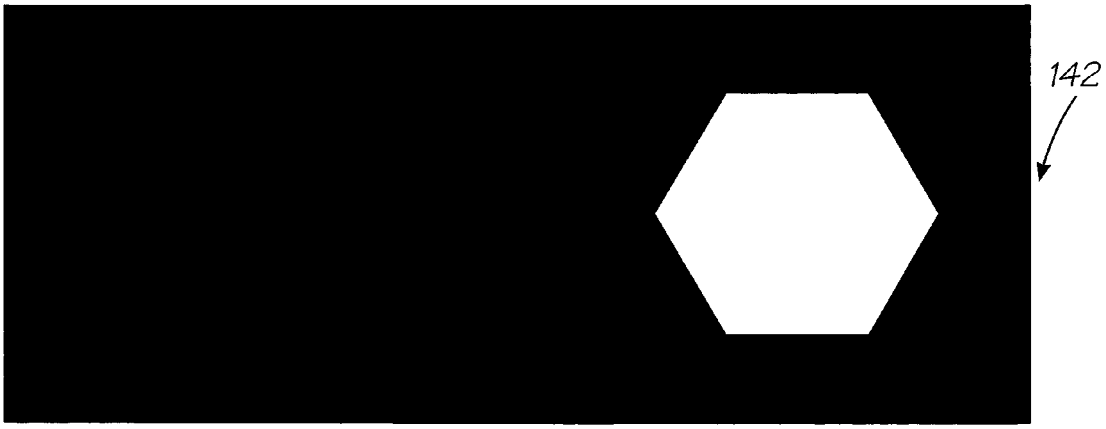
Figure 11A:
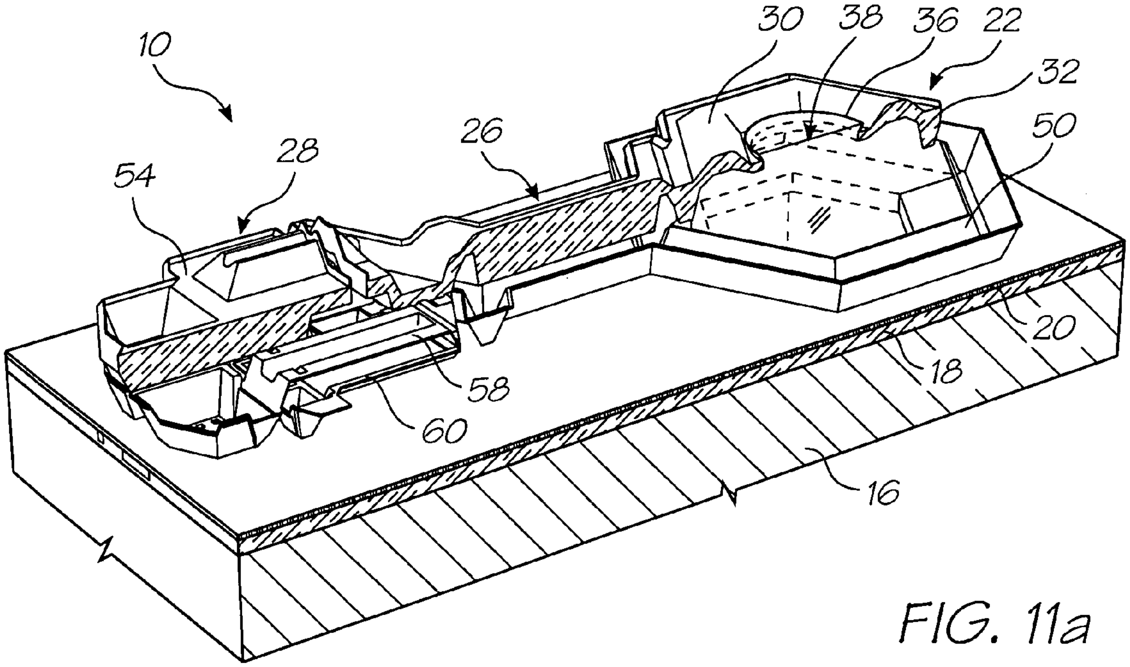
FIGS. 11*a* to 11*c* show three dimensional views of an operation of the nozzle assembly manufactured according to the method of FIGS. 8 and 9.
Figure 12A:
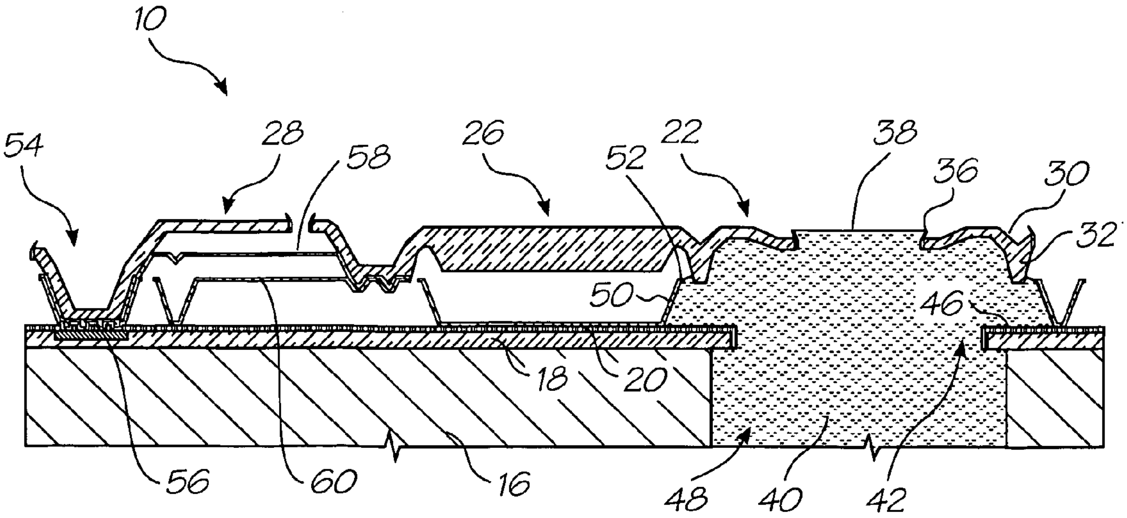
FIGS. 12*a* to 12*c* show sectional side views of an operation of the nozzle assembly manufactured according to the method of FIGS. 8 and 9.
Figure 11B:
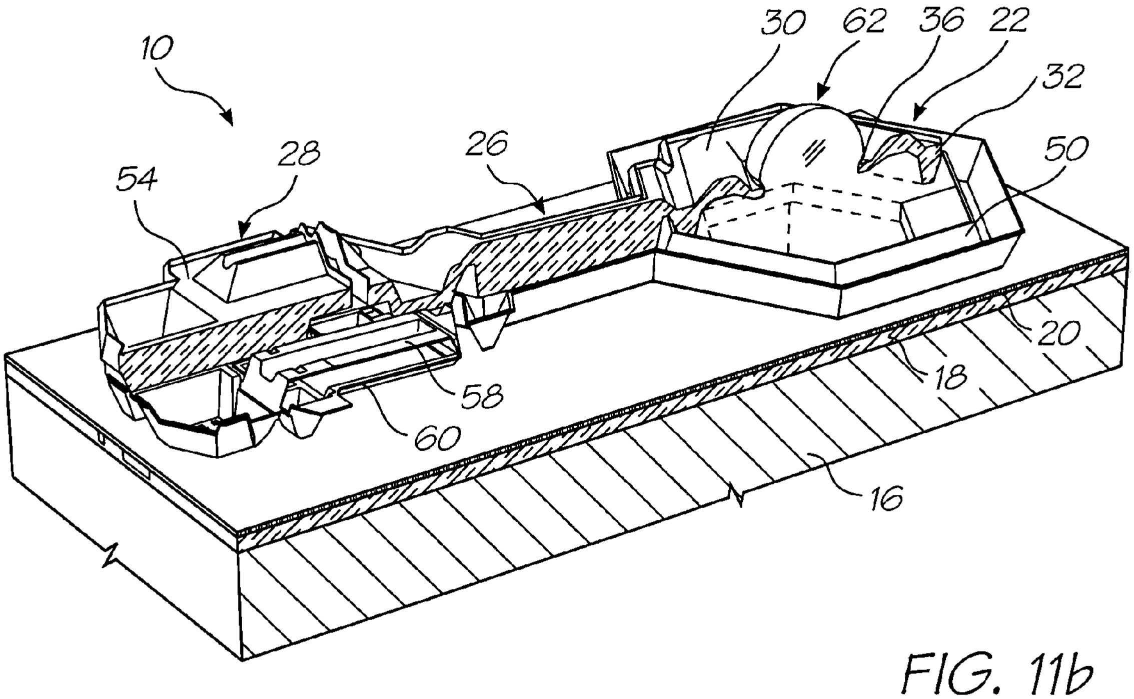
Figure 12B:
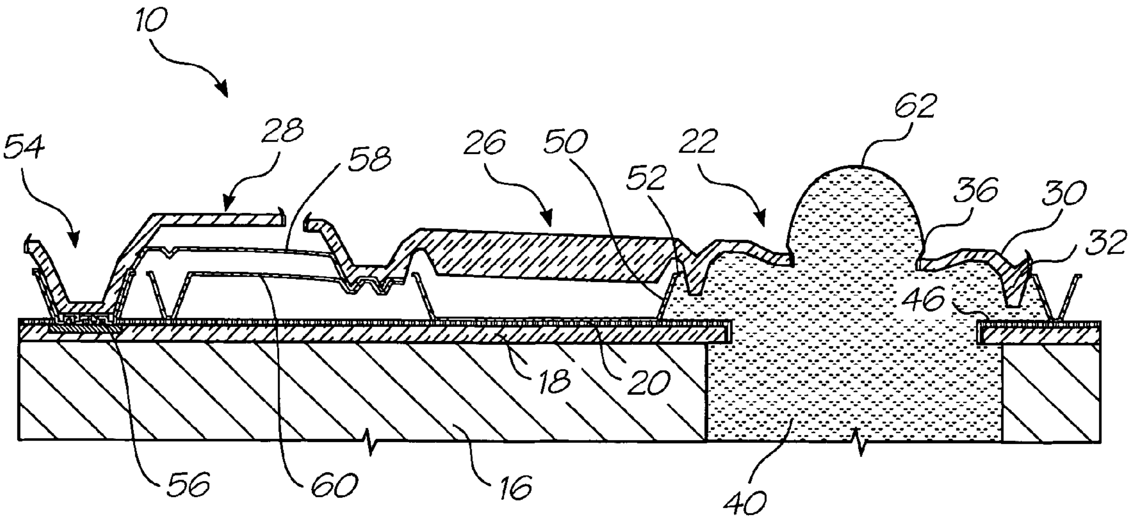
Figure 11C:
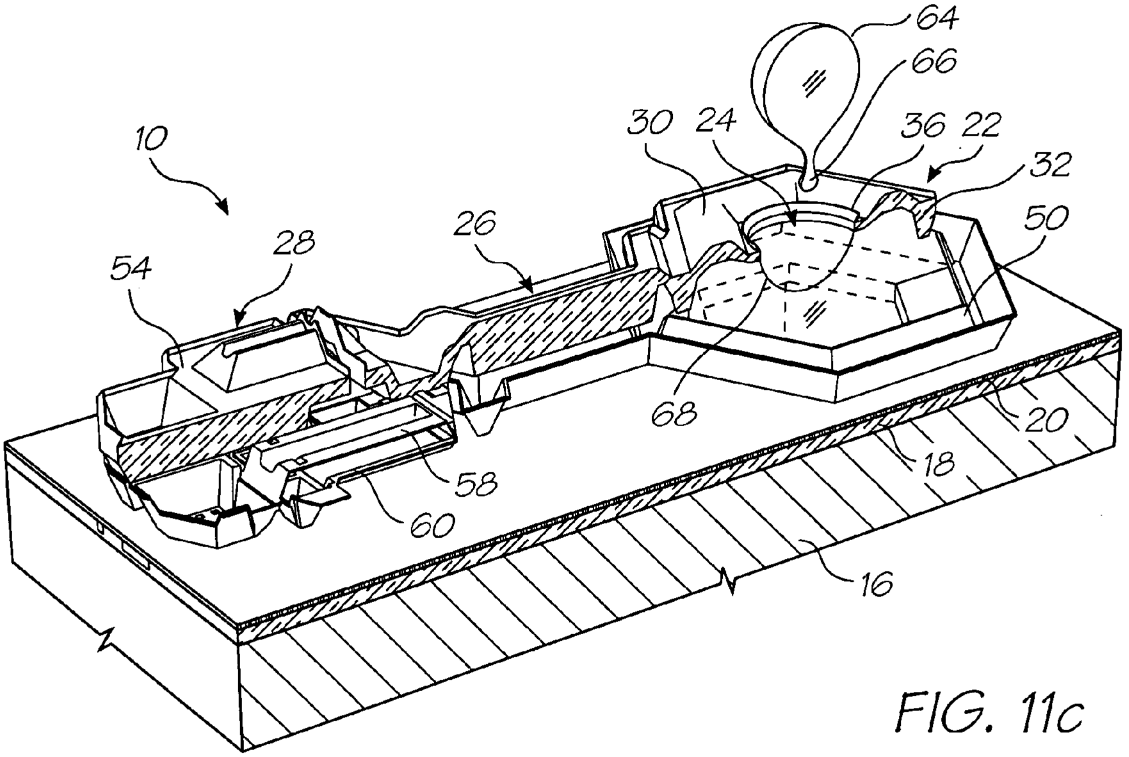
Figure 12C:
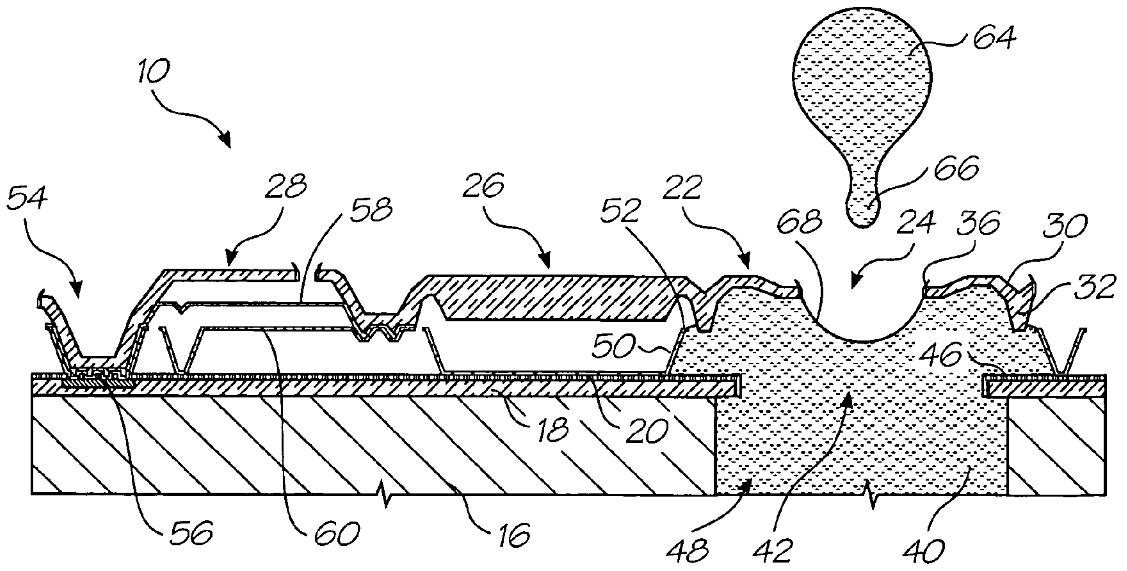

A further UV release tape (not shown) is applied to a rear of the wafer 16 and the tape 140 is removed. The sacrificial layers 108, 112, 120, 128 and 134 are stripped in oxygen plasma to provide the final nozzle assembly 10 as shown in FIGS. 8*r* and 9*r* of the drawings. For ease of reference, the reference numerals illustrated in these two drawings are the same as those in FIG. 1 of the drawings to indicate the relevant parts of the nozzle assembly 10. FIGS. 11 and 12 show the operation of the nozzle assembly 10, manufactured in accordance with the process described above with reference to FIGS. 8 and 9 and these figures correspond to FIGS. 2 to 4 of the drawings.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method of fabricating a micro-electromechanical device, the method comprising the steps of:

forming electrical connections to drive circuitry on a wafer substrate;

forming a first sacrificial structure on the wafer substrate that corresponds at least to a mechanical arm to be formed on the sacrificial structure, spaced from the wafer substrate;

forming at least the mechanical arm on the sacrificial structure;

forming a second sacrificial structure on the wafer substrate such that the second sacrificial structure corresponds at least to a heater element to be connected to the electrical connections, isolated from and overlying the mechanical arm;

forming the heater element on the second sacrificial structure;

forming a third sacrificial structure on the wafer substrate such that the third sacrificial structure corresponds at least to a structural formation that serves to fasten the heater element to the mechanical arm at a position spaced from the electrical connections such that resistive heating and subsequent cooling of the heater element as a result of an electrical current passing through the heater element results in displacement of the structural formation relative to the substrate; and forming the structural formation on the wafer substrate.

2. A method as claimed in claim 1, in which the step of forming the electrical connections to the drive circuitry includes the step of forming bond pads on the wafer substrate.

3. A method as claimed in claim 1, in which the step of forming the first sacrificial structure includes the step of forming first and second layers of sacrificial material on the wafer substrate.

4. A method as claimed in claim 1, in which the steps of forming the heater element and the mechanical arm include the steps of depositing and etching a multi-layer ceramic material.

5. A method as claimed in claim 4, in which the steps of forming the heater element and the mechanical arm include the steps of depositing and etching a material selected from the group comprising: Titanium Nitride, Titanium Boride, Molybdenum Disilicide and Titanium-Aluminum-Nitride.

6. A method as claimed in claim 5, in which the steps of forming the heater element and the mechanical arm include the steps of depositing a first layer of a material selected from said group, a second layer of a further ceramic, a third layer of the material selected from said group, a fourth layer of said further ceramic and a fifth layer of the material selected from said group.

7. A method as claimed in claim 6, in which the steps of depositing the second and fourth layers include the steps of depositing tantalum nitride.

* * * * *